United States Patent
Cheng et al.

(10) Patent No.: US 8,895,381 B1
(45) Date of Patent: Nov. 25, 2014

(54) METHOD OF CO-INTEGRATION OF STRAINED-SI AND RELAXED SI OR STRAINED SIGE FETS ON INSULATOR WITH PLANAR AND NON-PLANAR ARCHITECTURES

(71) Applicant: International Business Machines Corporation, Armonk, NY (US)

(72) Inventors: Kangguo Cheng, Schenectady, NY (US); Bruce B. Doris, Slingerlands, NY (US); Pouya Hashemi, White Plains, NY (US); Ali Khakifirooz, Mountain View, CA (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/967,994

(22) Filed: Aug. 15, 2013

(51) Int. Cl.
*H01L 21/336* (2006.01)
*H01L 21/8234* (2006.01)
*H01L 29/66* (2006.01)

(52) U.S. Cl.
CPC ................................ *H01L 29/66795* (2013.01)
USPC ............ 438/197; 257/E21.409; 257/E21.633; 257/E21.637; 438/283; 438/285; 438/438

(58) Field of Classification Search
USPC ................... 257/E21.409, E21.637, E21.633; 438/197, 283, 285, 438
See application file for complete search history.

(56) References Cited

U.S. PATENT DOCUMENTS

| | | | |
|---|---|---|---|
| 7,285,798 B2 | 10/2007 | Bhattacharyya | |
| 7,378,318 B2 | 5/2008 | Runyon et al. | |
| 7,524,740 B1* | 4/2009 | Liu et al. | 438/479 |
| 7,537,997 B2 | 5/2009 | Runyon et al. | |
| 7,741,166 B2 | 6/2010 | Belyansky et al. | |
| 7,875,511 B2 | 1/2011 | Yaocheng et al. | |
| 2006/0151776 A1* | 7/2006 | Hatada et al. | 257/19 |
| 2006/0186436 A1* | 8/2006 | Tamura et al. | 257/192 |
| 2007/0262385 A1* | 11/2007 | Nguyen et al. | 257/351 |
| 2008/0001178 A1* | 1/2008 | Gehring et al. | 257/213 |
| 2008/0044966 A1* | 2/2008 | Chan et al. | 438/198 |
| 2008/0135886 A1* | 6/2008 | Irisawa et al. | 257/255 |
| 2008/0179636 A1 | 7/2008 | Chidambarrao et al. | |
| 2012/0068267 A1 | 3/2012 | Bedell et al. | |
| 2012/0074464 A1* | 3/2012 | Cea et al. | 257/190 |
| 2012/0216158 A1 | 8/2012 | Bedell et al. | |
| 2013/0260518 A1* | 10/2013 | Buss | 438/199 |

* cited by examiner

*Primary Examiner* — Asok K Sarkar
(74) *Attorney, Agent, or Firm* — Scully, Scott, Murphy & Presser, P.C.; Louis J. Percello, Esq.

(57) ABSTRACT

A method of forming a semiconductor device that includes providing a substrate including a biaxial strained semiconductor layer that is present directly on a dielectric layer, and patterning the biaxial strained semiconductor layer to provide a first conductivity region of a laterally relaxed semiconductor portion and a second conductivity region of a biaxial strained semiconductor portion, wherein the laterally relaxed semiconductor portion is present over an undercut region in the dielectric layer.

A hydrogen anneal is applied to the first and second conductivity region, wherein the laterally relaxed semiconductor portion is relaxed to an unstrained state. A first semiconductor device is formed in first conductivity region and a second semiconductor device is formed in the second conductivity region.

25 Claims, 14 Drawing Sheets

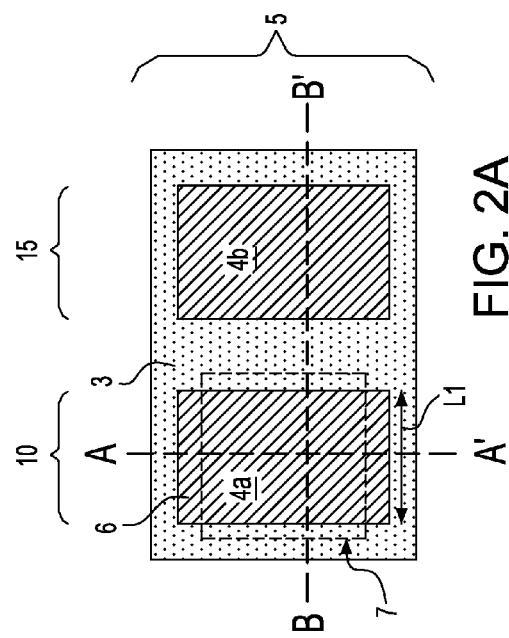
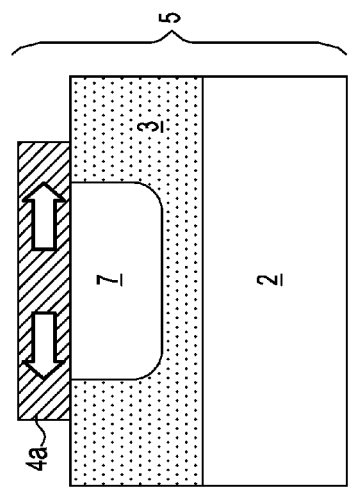
FIG. 2A
FIG. 2B
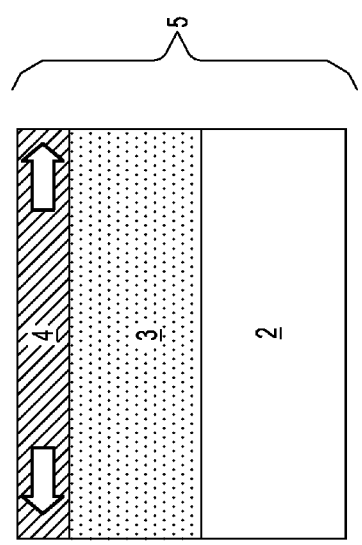
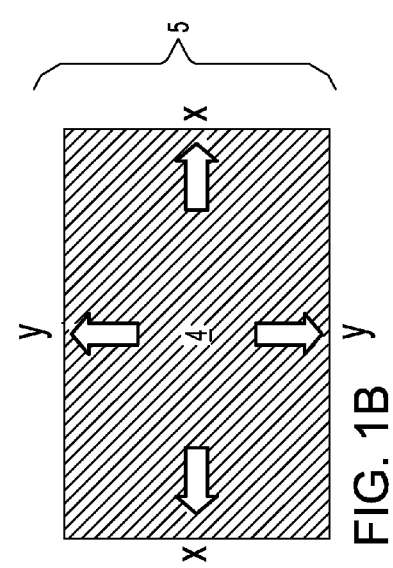
FIG. 1A
FIG. 1B

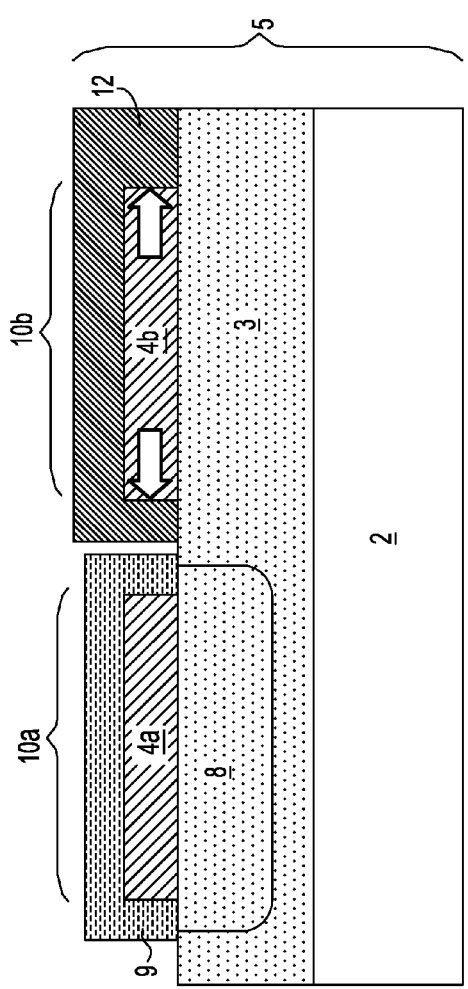
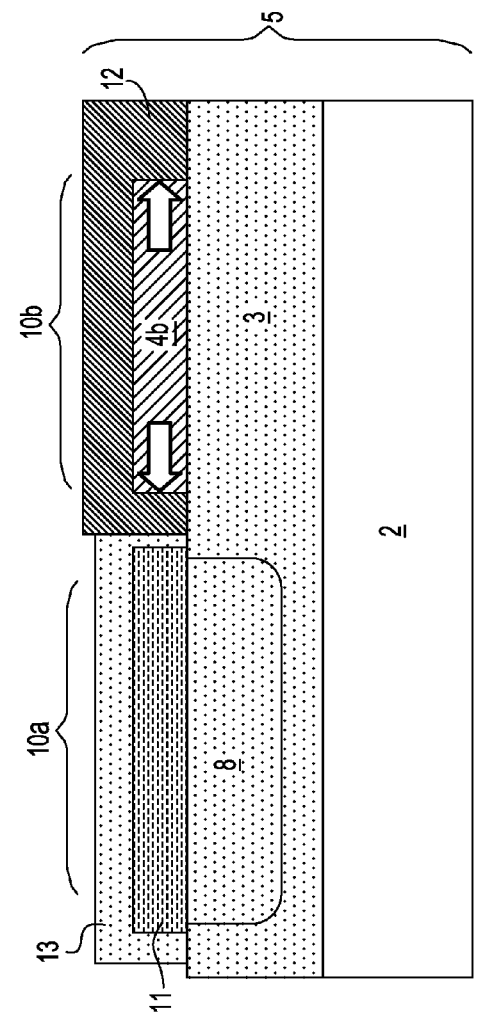
FIG. 6C
FIG. 7

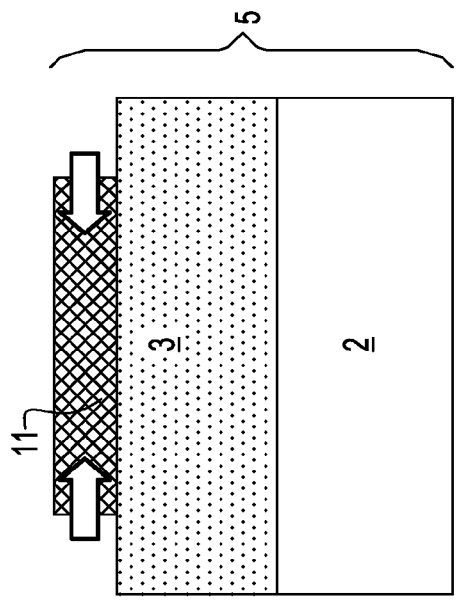
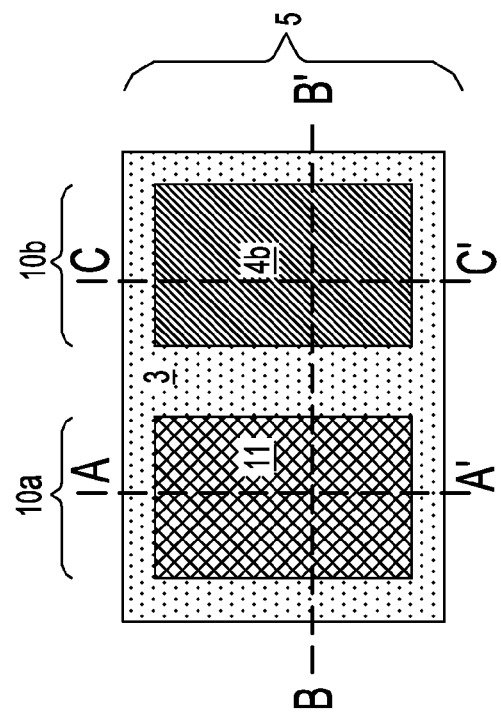
FIG. 8B
FIG. 8A

METHOD OF CO-INTEGRATION OF STRAINED-SI AND RELAXED SI OR STRAINED SIGE FETS ON INSULATOR WITH PLANAR AND NON-PLANAR ARCHITECTURES

BACKGROUND

The present disclosure relates to semiconductor fabrication and more particularly to a method of fabricating a strained semiconductor-on-insulator (SSOI) substrate.

In order to be able to make integrated circuits (ICs), such as memory, logic, and other devices, of higher integration density than currently feasible, one has to find ways to further downscale the dimensions of field effect transistors (FETs), such as metal-oxide-semiconductor field effect transistors (MOSFETs) and complementary metal oxide semiconductors (CMOS). Scaling achieves compactness and improves operating performance in devices by shrinking the overall dimensions and operating voltages of the device while maintaining the device's electrical properties.

SUMMARY OF THE INVENTION

In one embodiment, a method of forming a semiconductor device is provided that includes providing a substrate including a biaxially strained semiconductor layer that is present directly on a dielectric layer. The biaxially strained semiconductor layer is then patterned to provide a first conductivity region of a laterally relaxed semiconductor portion and a second conductivity region of a biaxially strained semiconductor portion. The laterally relaxed semiconductor portion is present over an undercut region in the dielectric layer. A hydrogen anneal is applied to the first and second conductivity regions, wherein the laterally relaxed semiconductor portion is relaxed to an unstrained state and the biaxially strained semiconductor portion in the second conductivity region remains strained. The undercut region may then be filled with a dielectric material. A first semiconductor device of a first conductivity may be formed in the first conductivity region and a second semiconductor device of a second conductivity may be formed in the second conductivity region.

In another embodiment, a method is provided for forming fin field effect transistors (finFETs). The method may begin with providing a substrate including a biaxially strained semiconductor layer that is present directly on a dielectric layer. The biaxially strained semiconductor layer is then patterned to provide a first conductivity region of laterally relaxed semiconductor fin structures and a second conductivity region of uniaxially strained semiconductor fin structures. The laterally relaxed semiconductor fin structures are present over an undercut region in the dielectric layer. A hydrogen anneal is applied to the first and second conductivity regions, wherein the laterally relaxed semiconductor fin structures are relaxed to an unstrained state and the uniaxially strained semiconductor fin structures in the second conductivity region remains strained. The undercut region may then be filled with a dielectric material. A first finFET semiconductor device of a first conductivity may be formed in the first conductivity region and a second finFET semiconductor device of a second conductivity may be formed in the second conductivity region.

In another embodiment, a method of forming a semiconductor device is provided that includes providing a substrate including a biaxially strained semiconductor layer of a first composition that is present directly on a dielectric layer. The biaxially strained semiconductor layer is then patterned to provide a first conductivity region of a laterally relaxed semiconductor portion and a second conductivity region of a biaxially strained semiconductor portion. The laterally relaxed semiconductor portion is present over an undercut region in the dielectric layer. A hydrogen anneal is applied to the first and second conductivity regions, wherein the laterally relaxed semiconductor portion is relaxed to an unstrained semiconductor layer and the biaxial strained semiconductor portion in the second conductivity region remains strained. The undercut region may then be filled with a dielectric material. A strained semiconductor layer of a second composition may then be formed on the unstrained semiconductor layer. A first semiconductor device of a first conductivity region may be formed in the first conductivity region and a second semiconductor device of a second conductivity region may be formed in the second conductivity region.

In another embodiment, a method of forming a semiconductor device is provided that includes providing a substrate including a biaxially strained semiconductor layer of a first composition that is present directly on a dielectric layer. The biaxially strained semiconductor layer is then patterned to provide a first conductivity region of laterally relaxed semiconductor fin structures and a second conductivity region of uniaxially strained semiconductor fin structures. The laterally relaxed semiconductor fin structures are present over an undercut region in the dielectric layer. A hydrogen anneal is applied to the first and second conductivity regions, wherein the laterally relaxed semiconductor fin structures are relaxed to unstrained semiconductor fin structures. The uniaxially strained semiconductor fin structures in the second conductivity region remain strained. The undercut region may then be filled with a dielectric material. A strained semiconductor layer of a second composition may then be formed on the unstrained semiconductor fin structures. A first finFET semiconductor device of a first conductivity region may be formed in the first conductivity region and a second finFET semiconductor device of a second conductivity region may be formed in the second conductivity region.

BRIEF DESCRIPTION OF THE DRAWINGS

The following detailed description, given by way of example and not intended to limit the disclosure solely thereto, will best be appreciated in conjunction with the accompanying drawings, wherein like reference numerals denote like elements and parts, in which:

FIG. 1A is a side cross-sectional view depicting one embodiment of a substrate including a biaxial strained semiconductor layer of a first composition that is present directly on a dielectric layer, in accordance with one embodiment of the present disclosure.

FIG. 1B is a top down view depicting the biaxially strained semiconductor layer that is depicted in FIG. 1A, in accordance with one embodiment of the present disclosure.

FIG. 2A is a top down view depicting one embodiment of patterning the biaxial strained semiconductor layer and forming an undercut region in the dielectric layer under the portion of the biaxially strained semiconductor layer that is present in the first conductivity region of the substrate to relax the biaxial strained semiconductor layer to a uniaxially strained semiconductor layer.

FIG. 2B is a side cross-sectional view along section line A-A' of FIG. 2A.

FIG. 6C is a side cross-sectional view along section line B-B' in FIG. 6A.

FIG. 7 is a side-cross sectional view along section line B-B' in FIG. 6A following a condensation process to intermix the strained semiconductor layer of the second composition with the unstrained semiconductor layer of the first composition.

FIG. 8A is a top down view depicting removing an oxide that is formed during the condensation process depicted in FIG. 7.

FIG. 8B is a side cross-sectional view along section line A-A' in FIG. 8A.

DETAILED DESCRIPTION OF THE INVENTION

Figure 2C:
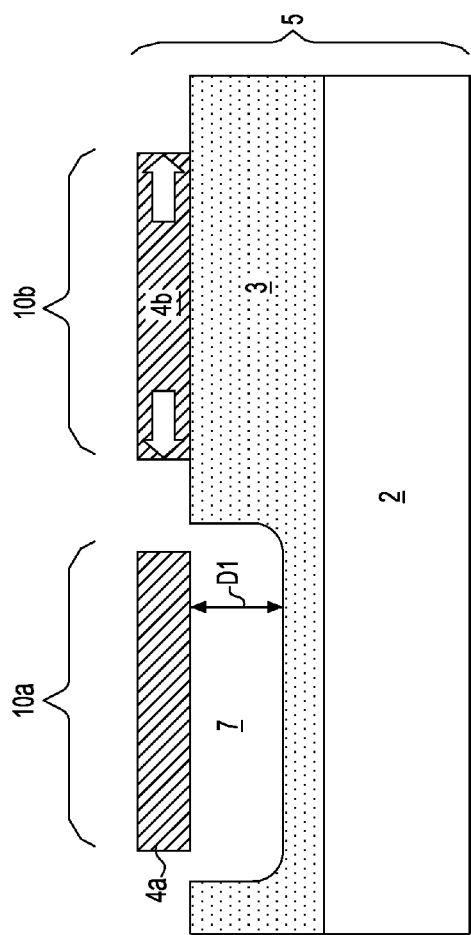
FIG. 2C is a side cross-sectional view along section line B-B' of FIG. 2A.

Detailed embodiments of the present disclosure are described herein; however, it is to be understood that the disclosed embodiments are merely illustrative of the structures and methods disclosed herein. In addition, each of the examples given in connection with the various embodiments of the disclosure is intended to be illustrative, and not restrictive. Even further, the figures are not necessarily to scale, some features may be exaggerated to show details of particular components. Further, when a particular feature, structure, or characteristic is described in connection with an embodiment, it is submitted that it is within the knowledge of one skilled in the art to affect such feature, structure, or characteristic in connection with other embodiments whether or not explicitly described. For purposes of the description hereinafter, the terms "upper", "lower" "vertical", "horizontal", "top", "bottom", and derivatives thereof shall relate to the structures disclosed herein, as they are oriented in the drawing figures.

It has been determined that strained silicon directly on insulator (SSDOI) substrates have a uniaxial tensile strain that can provide a performance enhancement for n-type semiconductor devices. The term "directly on" as used to describe the SSDOI substrate means that a first element, such as a strained semiconductor layer, and a second element, such as a dielectric layer, are connected without any intermediary conducting, insulating or semiconductor layers at the interface of the two elements. The term "strained" as used to describe the strained semiconductor layer of the SSDOI substrate means that the layer has an intrinsic compressive or tensile strain. An "intrinsic strain" as used herein refers to a strain, either compressive or tensile, that is developed within the strained layer, rather than an extrinsic strain that is applied to the layer by an external force.

By "performance enhancement" it is meant an increase in carrier mobility. It has also been determined that that uniaxial tensile strain that provides the performance enhancement for the n-type semiconductor devices produces a performance decrease in the p-type semiconductor devices. As used herein, the term "n-type" or "p-type" as used to describe the conductivity of the semiconductor device denotes whether the source and drain regions of the semiconductor device are doped to an n-type or p-type conductivity. As used herein, "p-type" refers to the addition of impurities to an intrinsic semiconductor, e.g., semiconductor source and drain region that creates deficiencies of valence electrons. In a silicon-containing substrate, examples of p-type dopants, i.e., impurities include but are not limited to boron, aluminum, gallium and indium. As used herein, "n-type" refers to the addition of impurities that contributes free electrons to an intrinsic semiconductor. In a silicon containing substrate, examples of n-type dopants, i.e., impurities, include but are not limited to, antimony, arsenic and phosphorous.

Relaxing the strain that may be present in the regions of the semiconductor substrates in which p-type semiconductor devices may be present is not trivial. For example, relaxation of strain via ion implantation damages the lattice structure of the material. This can negatively impact device performance. The use of compressively strained silicon germanium to remove the uniaxial tensile strain that degrades p-type semiconductor device performance also has disadvantages. For example, the level of germanium that is required to provide the compressive strain necessary to neutralize the tensile strain can cause integration problems and can cause difficulties in passivating the gate dielectric of the semiconductor device.

In some embodiments, the methods and structures disclosed herein can overcome the aforementioned difficulties through relaxation of the strain in the regions of the substrate including p-type semiconductor devices using a localized suspension method followed by a high temperature hydrogen anneal. The term "localized suspension" denotes that at least a portion of the strained semiconductor layer is separated from the underlying dielectric layer that it is in direct contact with prior to being suspended. Some embodiments of the localized suspension method will be described in greater detail below. The term "hydrogen anneal" denotes an anneal at a temperature greater than 750° C. in an atmosphere that includes at least hydrogen. In some embodiments, after the strained semiconductor layer of the SSDOI substrate is separated from the underlying dielectric layer, the hydrogen anneal allows for the microstructure to relax from a strained state to a neutral strain. The term "neutral strain" denotes a strain ranging from 0 MPa to 200 MPa. In comparison to a neutral strain, the term "compressive strain" denotes a strain ranging from 200 MPa to 4 GPa. In comparison to a neutral strain, the term "tensile strain" denotes a strain ranging from 200 MPa to 4 GPa. The details of some embodiments of the above described method are now discussed in greater detail with references to FIGS. 1-15.

FIG. 1 depicts one embodiment of a strained semiconductor directly on insulator (SSDOI) substrate 5. In one embodiment, the SSDOI substrate 5 includes a biaxially strained semiconductor layer 4 of a first composition semiconductor material over a dielectric layer 3. In some embodiments, the dielectric layer 3 separates the overlying biaxially strained semiconductor layer 4 from an underlying base semiconductor layer 2. The biaxially strained semiconductor layer 4 of the first composition semiconductor material may be a silicon containing layer. In some embodiments, the first composition semiconductor material that provides the biaxially strained semiconductor layer 4 is silicon (Si). For example, the biaxially strained semiconductor layer 4 may be composed entirely of silicon (Si), e.g., 100 wt. %. The biaxially strained semiconductor layer 4 may also be composed substantially entirely of silicon (Si) with incidental impurities. In another embodiment, the first composition semiconductor material that provides the biaxially strained semiconductor layer 4 is a silicon-containing material that is greater than 90% silicon. In another embodiment, the biaxially strained semiconductor layer 4 is a silicon-containing material that is greater than 95% silicon. In yet another embodiment, the biaxially strained semiconductor layer 4 is comprised of greater than 99% silicon, e.g., 100% silicon. The aforementioned percentages allow for doping with n-type and p-type dopants.

The biaxially strained semiconductor layer 4 may have a thickness ranging from 1 nm to 100 nm. In some embodiments, the biaxially strained semiconductor layer 4 may be thinned to a thickness of an extremely thin semiconductor on insulator (ETSOI) layer by planarization, grinding, wet etch, dry etch, oxidation followed by oxide etch, or any combination thereof. One method of thinning the biaxially strained semiconductor layer 4 is to oxidize the silicon by a thermal dry or wet oxidation process, and then wet etch the oxide layer using a hydrofluoric acid mixture. This process can be repeated to achieve the desired thickness. In one embodiment, the biaxially strained semiconductor layer 4 has a thickness ranging from 1.0 nm to 10.0 nm. In another embodiment, the biaxially strained semiconductor layer 4 has a thickness ranging from 1.0 nm to 5.0 nm. In a further embodiment, the biaxially strained semiconductor layer 4 has a thickness ranging from 3.0 nm to 8.0 nm.

The biaxially strained semiconductor layer 4 is typically composed of a single crystal crystalline material. The term "single crystal crystalline structure" denotes a crystalline solid in which atoms are arranged following specific pattern throughout the entire piece of material. In some embodiments, the single crystal crystalline structure is a crystalline solid, in which the crystal lattice of the entire sample is substantially continuous and substantially unbroken to the edges of the sample. In some embodiments, the single crystal crystalline structure has substantially no grain boundaries. In one example, the biaxially strained semiconductor layer 4 may be composed of single crystal silicon (Si). In one example, the biaxially strained semiconductor layer 4 has a (100) crystal orientation. The crystal orientation of the biaxially strained semiconductor layer 4 may also be (110) and (111).

In some embodiments, the biaxially strained semiconductor layer 4 is silicon (Si) having an internal tensile stress. For example, in one embodiment, the intrinsic tensile stress in the biaxially strained semiconductor layer 4 of silicon (Si) may range from 100 MPa to 6 GPa. In another embodiment, the intrinsic tensile stress in the biaxially strained semiconductor layer 4 of silicon (Si) may range from 200 MPa to 1 GPa.

The dielectric layer 3 separates the biaxially strained semiconductor layer 4 from the base semiconductor layer 2. The dielectric layer 3 may be an oxide, nitride and/or oxynitride material. The dielectric layer 3 may also be composed of a high-k dielectric, such as aluminum oxide or hafnium dioxide. In one embodiment, the dielectric layer 3 is an oxide. In one embodiment, the dielectric layer 3 of the SSDOI substrate 5 has a thickness ranging from 10 nm to 500 nm. In another embodiment, the dielectric layer 3 of the SSDOI substrate 5 has a thickness ranging from 50 nm to 100 nm.

The base semiconductor layer 2 may be comprised of a same or a different material as the biaxially strained semiconductor layer 4. In one embodiment, the base semiconductor layer 2 may comprise at least one of Si, Ge, SiGe, GaAs, InAs, InP, SiCGe, SiC, as well as other III/V or II/VI compound semiconductors and alloys thereof. In one example, the base semiconductor layer 2 may be amorphous, polycrystalline, or monocrystalline. The base semiconductor layer 2 may have a thickness ranging from 5 nm to 1000 microns.

The SSDOI substrate 5 may be fabricated by providing a "donor" wafer and a "handle" wafer in combination with wafer bonding and smart cut processing. For example, the donor wafer may be formed by epitaxially growing a relaxed silicon germanium (SiGe) layer on a silicon (Si) containing substrate. A silicon (Si) layer may then be grown on the relaxed silicon germanium (SiGe) layer. The silicon (Si) layer that is grown on the relaxed silicon germanium (SiGe) layer will typically be biaxially strained with a tensile strain. A dielectric layer, such as silicon oxide ($SiO_2$), may then grown on the silicon (Si) layer. Forming the dielectric layer on the biaxially strained silicon (Si) layer memorizes the biaxial strain within the silicon (Si) layer to provide an intrinsic tensile strain. The donor wafer may then be implanted with hydrogen and bonded to a handle wafer. Annealing is then performed to bond the wafers and cleave the donor wafer at the location where the peak of the hydrogen implant is located. The silicon germanium (SiGe) layer is then etched away leaving the biaxially strained silicon (Si) layer on the dielectric layer, wherein the dielectric layer is present on top of the handle wafer. In this embodiment, the biaxially strained silicon (Si) layer provides the biaxially strained semiconductor layer 4 of the SSDOI substrate 5 and the handle wafer provides the base semiconductor layer 2 of the SSDOI substrate 5. The dielectric layer that memorizes the strain in the biaxially strained semiconductor layer 4, provides the dielectric layer 3 that is separating the biaxially strained semiconductor layer 4 from the base semiconductor layer 2.

The term "biaxially strained" means that a strain is produced in two directions that are both parallel to a plane defined by the upper surface of the substrate. For example, FIG. 1B is a top down view of a biaxially strained SSDOI substrate 5, in which strain is present in both the x-direction (depicted as arrow X-X) and the y-direction (depicted as arrow Y-Y). In one embodiment, the biaxial strain that is formed in the biaxially strained semiconductor layer 4 of the SSDOI substrate 5 is a tensile strain.

Referring to FIGS. 2A and 2B, in some embodiments, the biaxially strained semiconductor layer 4 may be etched to define islands in a first conductivity region 10 of the SSDOI substrate 5 and a second conductivity region 15 of the SSDOI substrate 5. By "conductivity" it is meant that the region is further processed to provide semiconductor devices having either an n-type conductivity or a p-type conductivity. For example, a p-type conductivity semiconductor device, such as a p-type field effect transistors (pFET) or a p-type fin field effect transistor (p-type finFET), is a semiconductor device in which the source and drain regions of the device are doped with a p-type dopant. An n-type conductivity semiconductor device, such as an n-type field effect transistor (nFET) or the n-type fin field effect (n-type finFET), is a semiconductor device in which the source and drain regions of the device are doped with an n-type dopant. In some embodiments, in which the tensile strain of the biaxially strained semiconductor layer 4 is relaxed in the first conductivity region 10 of the SSDOI substrate 5, the first conductivity region 10 provides the site for subsequently formed p-type semiconductor devices, such as p-type field effect transistors (pFETs) or p-type fin field effect transistors (p-type finFETs). In some embodiments, in which the tensile strain of the biaxially strained layer 4 is maintained in the second conductivity region 15 of the SSDOI substrate 5, the second conductivity region 15 provides the site for the subsequently formed n-type field effect transistors (nFETs) or n-type fin field effect transistors (n-type finFETs).

The islands of the semiconductor material that remain following etching of the biaxially strained semiconductor layer 4 include a biaxially strained semiconductor portion 4b that is present in the second conductivity region, and a laterally relaxed semiconductor portion 4a that is processed to an unstrained state in the first conductivity region 10. The islands of material from the biaxially strained semiconductor layer are patterned using deposition, photolithography and etch processes. For example, patterning the biaxially strained semiconductor layer 4 to provide the islands of semiconductor material for the biaxially strained semiconductor portion 4b and the laterally relaxed semiconductor portion 4a may include forming a first etch mask (not shown) over portions of the biaxially strained semiconductor layer 4 that are present in the first conductivity region 10 and the second conductivity region 15, and etching the biaxially strained semiconductor layer 4 selectively to the first etch mask and the dielectric layer 3.

In one embodiment, the first etch mask is composed of a photoresist material. In another embodiment, the first etch mask is a hardmask composed of a nitride containing material, such as silicon nitride. In one embodiment, in which the first etch mask is composed of a photoresist material, the first etch mask may be formed using deposition, photolithography and development process steps. For example, the photoresist mask that provides the first etch mask may be formed by applying a photoresist to the surface to be etched, exposing the photoresist to a pattern of radiation, and then developing the pattern into the photoresist utilizing resist developer.

Once the patterning of the photoresist is completed, the sections covered by the photoresist are protected, while the exposed regions are removed using a first selective etching process that removes the unprotected regions of the photoresist. As used herein, the term "selective" in reference to a material removal process denotes that the rate of material removal for a first material is greater than the rate of removal for at least another material of the structure to which the material removal process is being applied. In one embodiment, the selectivity may be greater than 10:1. In another embodiment, the selectivity may be greater than 100:1.

In one embodiment, the first selective etch process removes the exposed portions of biaxially strained semiconductor layer 4 that is present in the first conductivity region 10 with an etch chemistry that is selective to the dielectric layer 3 of the SSDOI substrate 5. In one embodiment, the etch process that removes the exposed portions of the biaxially strained semiconductor layer 4 is an anisotropic etch process. An anisotropic etch process is a material removal process in which the etch rate in the direction normal to the surface to be etched is greater than in the direction parallel to the surface to be etched. The anisotropic etch may include reactive-ion etching (RIE). Following the first selective etch process, the first etch mask is removed.

In some embodiments, patterning the biaxially strained semiconductor layer 4 further includes forming an undercut region 7 in the first conductivity region 10. In some embodiments, by forming the undercut region 10, the island of biaxially strained semiconductor material that is present in the first conductivity region 10 is relaxed to a uniaxial state. By "uniaxial" and "uniaxially" it is meant that the stress within the biaxially strained semiconductor material is relaxed in one direction, so that the stress is present in only one direction, e.g., x-direction or y-direction. In one embodiment, forming the undercut region 7 may include applying a second etch mask (not shown) over the second conductivity region 15 and anchor portions 6 of the biaxially strained semiconductor layer in the first conductivity region 10, and applying an undercut etch to portions of the dielectric layer 3 that are not covered by the second etch mask. Similar to the first etch mask, the second etch mask may be composed of a soft mask material, e.g., photoresist, or formed of a hard mask material, e.g., silicon oxides, silicon nitrides, silicon oxynitrides, silicon carbides, silicon carbonitrides, etc. Spin-on dielectrics may also be utilized as a hardmask material including, but not limited to, silsequioxanes, siloxanes, and boron phosphate silicate glass (BPSG). Similar to the first etch mask, the second etch mask may be formed using deposition, photolithography and etch processes.

The second etch mask protects the biaxially strained semiconductor portion 4b in the second conductivity region 15 and protects the portions of the dielectric layer 3 underlying the anchor portions 6 of the laterally relaxed semiconductor portion 4a in the first conductivity region 15. The anchor portions 6 of the dielectric layer 3 support the biaxially strained island of material 4a that is within the first conductivity region 15 following the application of the undercut etch that suspends the biaxially strained island of material for lateral relaxation.

Still referring to FIGS. 2A and 2B, following formation of the second etch mask, an undercut etching process is applied to the biaxially strained island of material 4a in the first conductivity region 10, wherein removing the dielectric layer 3 from under the biaxially strained island of material 4a allows for the biaxially strained island of material 4a to be laterally relaxed in at least one direction. The term "laterally relaxed" means that the strain of the biaxially strained island of material 4a is relaxed in one direction, e.g., the y-direction (identified by A-A') or x-direction (identified by B-B'), while a strain is maintained in one direction, i.e., the other of the y-direction or the x-direction that is not relaxed.

The undercut etch may be a non-directional etch, i.e., isotropic etch, that is selective to the second etch mask. In some embodiments, the undercut etch is also selective to the island of material 4a that is present in the first conductivity region 10 of the substrate. In one example, when the island of material 4a that is present in the first conductivity region 10 includes silicon, and the material of the dielectric layer 3 being removed is silicon oxide, the undercut etch may be a wet etch composed of hydrofluoric acid (HF).

The undercut etch may form an undercut region 7 having a depth D1 ranging from 5 nm to 2000 nm. In another embodiment, the undercut etch may form an undercut region 7 having a depth D1 ranging from 40 nm to 200 nm. In yet another embodiment, the undercut etch may form an undercut region 7 having a depth D1 ranging from 40 nm to 1000 nm.

The anchor portions 6 of the island of material 4a that is present in the first conductivity region 10 may have a length L1 ranging from 20 nm to 2000 nm. In another embodiment, the anchor portions 6 of the island of material 4a that is present in the first conductivity region 10 may have a length L1 ranging from 50 nm to 100 nm. In yet another embodiment, the anchor portions 6 of the island of material 4a that is present in the first conductivity region 10 may have a length L1 ranging from 20 nm to 200 nm.

Following formation of the undercut region 7, the uniaxial strain that is present in the laterally relaxed semiconductor portion 4a may be a tensile strain along the y-direction (identified by A-A' in FIG. 2A). The uniaxial tensile strain may range from 200 MPa to 3000 MPa. In another embodiment, the uniaxial tensile strain may range from 1500 MPa to 2000 MPa. In yet another embodiment, the uniaxial tensile strain may range from 1000 MPa to 2000 MPa.

Figure 3B:
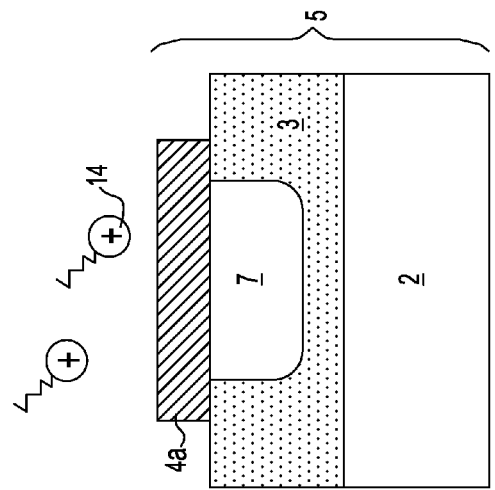
FIG. 3B is a side cross-sectional view along section line A-A' of FIG. 3A.
Figure 3A:
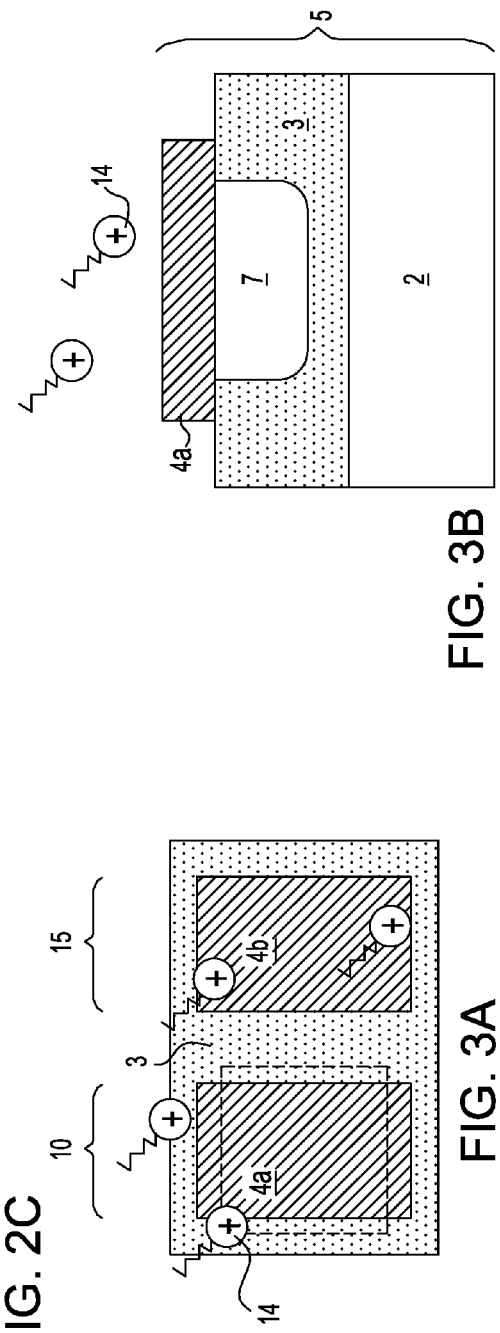
FIG. 3A is a top down view depicting one embodiment of a hydrogen anneal being applied to the first and second conductivity regions, wherein the uniaxially strained semiconductor layer is relaxed to an unstrained state.

FIGS. 3A and 3B depict one embodiment of a hydrogen anneal 14 being applied to the first and second conductivity regions 10, 15 of the SSDOI substrate 5. In some embodiments, the laterally relaxed semiconductor portion 4a, which may also be referred to as a uniaxially strained semiconductor layer, that is present in the first conductivity region 10 is relaxed to an unstrained state, and the biaxially strained semiconductor portion 4b in the second conductivity region 15 remains strained. In some embodiments, and because the uniaxially strained semiconductor portion 4a is suspended over the undercut region 7 formed in the dielectric layer 3 within the first conductivity region 10, the uniaxially strained semiconductor layer 4a is relaxed to the unstrained state by the hydrogen anneal 14.

By "unstrained state" it is meant that the stress that is present in the laterally relaxed semiconductor layer 4a in the first conductivity region 10 that is in the unstrained state is less than 200 MPa. In another embodiment, the stress that is present in the relaxed semiconductor layer 4a that is in the unstrained state is less than 50 MPa. In yet another embodiment, the stress that is present in the relaxed semiconductor layer that is in the unstrained state may range from 0 MPa to 100 MPa.

The biaxially strained semiconductor layer (identified by reference number 4b) in the second conductivity region 15 remains strained, because the entirety of the biaxially strained semiconductor layer 4b that is present in the second conductivity region 15 is in direct contact with the underlying dielectric layer 3. In one embodiment, the stress that is present in the biaxially strained semiconductor layer (identified by reference number 4b) in the second conductivity region 15 ranges from 1000 MPa to 4000 MPa. In another embodiment, the stress that is present in the biaxially strained semiconductor layer (identified by reference number 4b) in the second conductivity region 15 ranges from 1500 MPa to 2500 MPa.

In some embodiments, the hydrogen anneal 14 that is performed in the present method is a rapid thermal anneal process that is carried out in the presence of an atmosphere comprising hydrogen. For example, the hydrogen anneal 14 may include a temperature of at least 800° C., and the hydrogen anneal 14 may be carried out for a time period of 300 seconds or less. In some embodiments, the hydrogen anneal 14 is carried out at a temperature within a range of 900° C. to 1000° C. for a time period of from 5 seconds to 60 seconds. In another embodiment, the hydrogen anneal 14 is carried out at a temperature of from 900° C. to 950° C. for a time period of from 5 seconds to 20 seconds.

Although atmospheric pressure may be used, some embodiments can use a reduced pressure relative to atmospheric during the hydrogen anneal 14 step. In one example, the hydrogen anneal 14 can be carried out with a pressure of about 100 Torr or less. In another example, the hydrogen anneal 14 can be carried out with a pressure of 10 Torr or less. As stated above, the hydrogen anneal 14 can be carried out in an atmosphere of hydrogen. Hydrogen may be used alone, or in some embodiments, hydrogen may be admixed with an inert gas such as He, Ar or $N_2$.

Figure 4A:
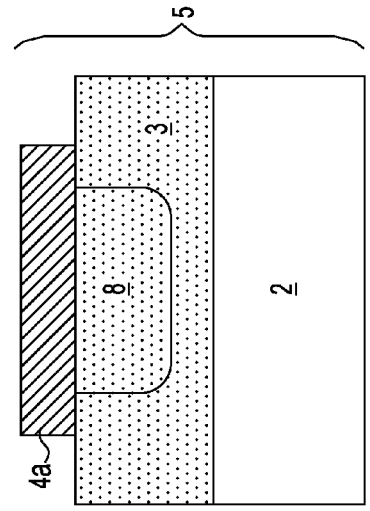
FIG. 4A is a top down view depicting filling the undercut region with a dielectric material, in accordance with one embodiment of the present disclosure.
Figure 4B:
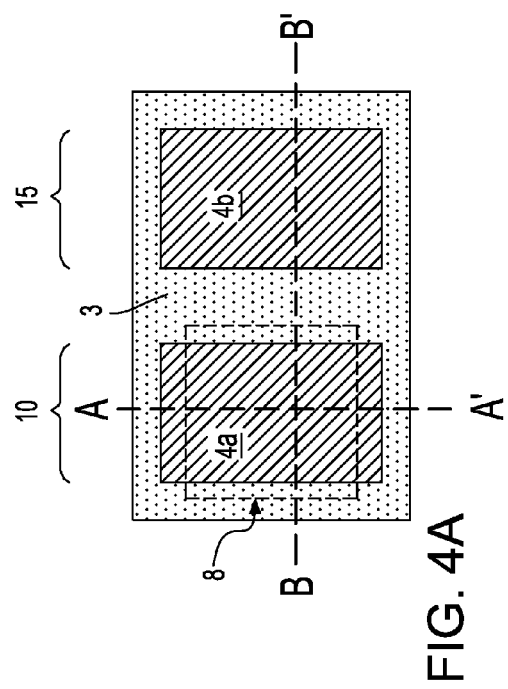
FIG. 4B is a side cross-sectional view along section line A-A' in FIG. 4A.
Figure 4C:
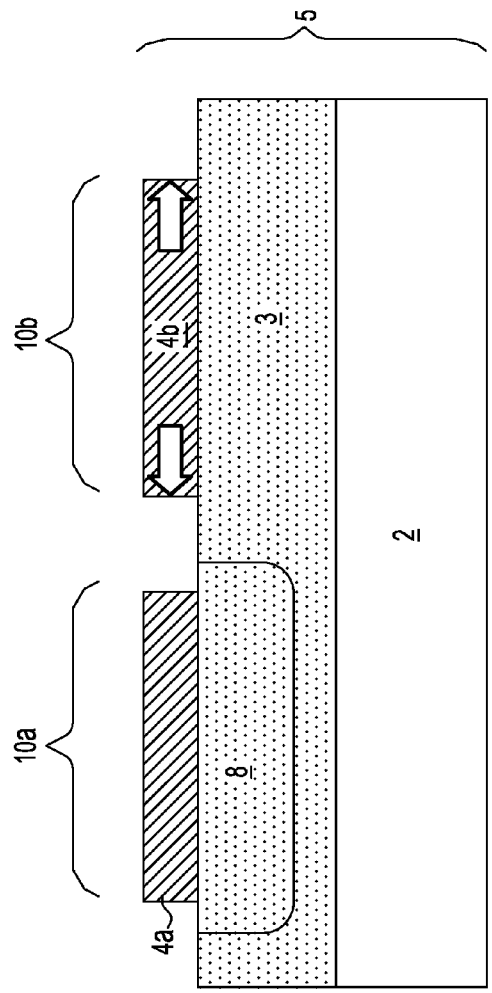
FIG. 4C is a side cross-sectional view along section line B-B' in FIG. 4A.

FIGS. 4A-4C depict one embodiment of filling the undercut region 7 with a dielectric material 8. The dielectric material 8 that fills the undercut region 7 may be any dielectric, such as an oxide, nitride, and oxynitride. For example, when the dielectric material 8 is an oxide, the dielectric material 8 may be silicon oxide. In another example, when the dielectric material 8 is a nitride, the dielectric material 8 may be silicon nitride. Other examples of materials that are suitable for the dielectric material 8 may include SiC, SiCO, SiCOH, and SiCH compounds, carbon-doped oxides, inorganic oxides, inorganic polymers, hybrid polymers, organic polymers such as polyamides or SiLK™, other carbon-containing materials, organo-inorganic materials, such as spin-on glasses and silsesquioxane-based materials, and diamond-like carbon (DLC, also known as amorphous hydrogenated carbon, a-C:H). Additional choices for the dielectric material 8 that fills the undercut region 7 include any of the aforementioned materials in porous form, or in a form that changes during processing to or from being porous and/or permeable to being non-porous and/or non-permeable.

The dielectric material 8 that fills the undercut region 7 may be deposited using chemical vapor deposition (CVD), physical vapor deposition (PVD), or a combination thereof. Some methods for depositing the dielectric material 8 may include plasma-assisted chemical vapor deposition (PECVD), high-density chemical vapor deposition (HD-CVD), plating, sputtering, evaporation and chemical solution deposition. In some embodiments, the deposition process completely fills the undercut region so that the upper surface of the dielectric material 8 contacts the lower surface of the relaxed semiconductor layer 4a in the first conductivity region 10 that is in the unstrained state.

Figure 5:
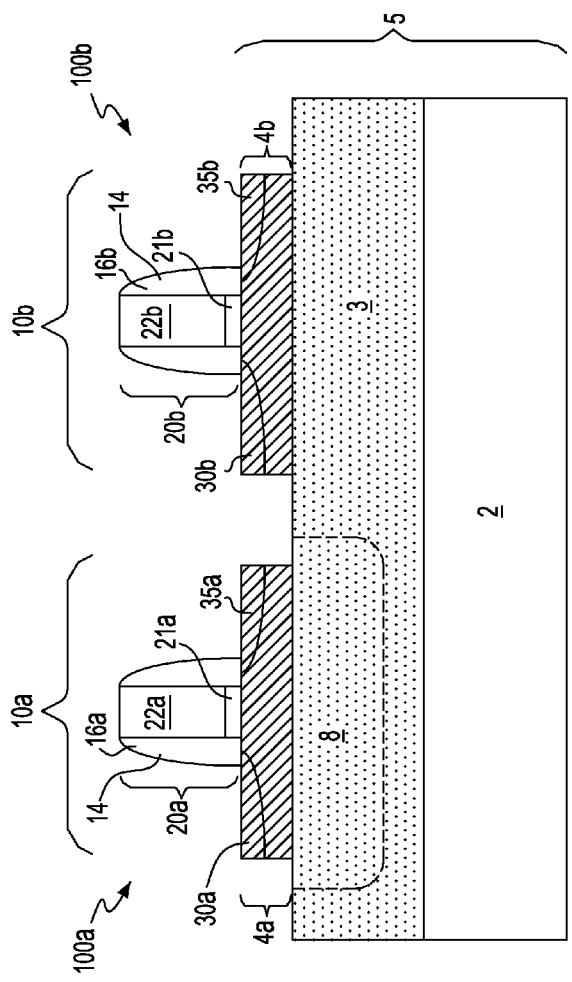
FIG. 5 is a side cross-sectional view depicting one embodiment of forming a first semiconductor device of a first conductivity region in the first conductivity region and forming a second semiconductor device of a second conductivity region in the second conductivity region of the structure depicted in FIGS. 4A-4C.

FIG. 5 depicts forming a first semiconductor device 100a of a first conductivity in the first conductivity region 10 and forming a second semiconductor device 100b of a second conductivity in the second conductivity region 15 of the structure depicted in FIGS. 4A-4C. In one embodiment, forming the first and second semiconductor devices 100a, 100b may begin with forming a well region in each of the first and second conductivity regions 10, 15. For example, in the first conductivity region 10, in which the first semiconductor device 100a has a p-type conductivity, the well region being formed may have an n-type conductivity, while in the second conductivity region 15, in which the second conductivity device 100b has an n-type conductivity, the well region being formed may have a p-type conductivity.

A first gate structure 20a may be formed in the first conductivity region 10 and a second gate structure 20b may be formed in the second conductivity region 15. Each of the first gate structure 20a and the second gate structure 20b may include at least one gate dielectric 21a, 21b and at least one gate conductor 22a, 22b.

Each of the gate structures 20a, 20b may be formed using deposition, photolithography and etch processes. More specifically, in some embodiments, at least one gate dielectric layer for the gate dielectrics 21a, 21b may be deposited on the upper surface of the relaxed semiconductor portion 4a, i.e., the laterally relaxed semiconductor portion 4a that has been relaxed to an unstrained state, in the first conductivity region 10, and the upper surface of the biaxially strained semiconductor material 4b in the second conductivity region 15 of the SSDOI substrate 5. The at least one gate dielectric layer that is formed in the first and second regions 20, 25 of the SSDOI substrate 5 may be composed of any dielectric material including oxides, nitrides and oxynitrides. In one embodiment, the least one gate dielectric layer may be provided by a high-k dielectric material. In one embodiment, the least one gate dielectric layer is composed of a high-k oxide such as, for example, $HfO_2$, $ZrO_2$, $Al_2O_3$, $TiO_2$, $La_2O_3$, $SrTiO_3$, $LaAlO_3$, $Y_2O_3$ and mixtures thereof. Other examples of high-k dielectric materials for the at least one gate dielectric layer include hafnium silicate, hafnium silicon oxynitride or combinations thereof. In one embodiment, the at least one gate dielectric layer may be deposited by chemical vapor deposition (CVD). Variations of CVD processes suitable for depositing the at least one gate dielectric layer include, but are not limited to, APCVD, LPCVD, PECVD, MOCVD, ALD and combinations thereof. In one embodiment, the thickness of the at least one gate dielectric layer is greater than 0.8 nm. More typically, the at least one gate dielectric layer has a thickness ranging from about 1.0 nm to about 6.0 nm.

In some embodiments, following the formation of the at least one gate dielectric layer, at least one gate conductor layer for the gate conductors 22a, 22b may be formed on the at least one gate dielectric layer to provide a gate stack. The at least one gate conductor layer may be formed by a deposition process, such as CVD, plasma-assisted CVD, plating, and/or sputtering, followed by planarization. In one embodiment, the at least one gate conductor layer is composed of metal or a doped semiconductor. Examples of metals that may be employed for the at least one gate conductor layer may include, but is not limited to, W, Ni, Ti, Mo, Ta, Cu, Pt, Ag, Au, Ru, Ir, Rh, and Re, Al, TiN, WN, TaN, TiAlN, TaAlN, and alloys thereof. One example of a doped semiconductor that is suitable for the at least one gate conductor layer is doped polysilicon.

The gate stack may then be patterned and etched to provide the first gate structure 20a in the first conductivity region 10 of the substrate 5, and the second gate structure 20b in the second conductivity region 15 of the substrate 5. Specifically, and in one example, a pattern is produced by applying a photoresist over the surfaces to be etched, i.e., at least one gate conductor layer and at least one gate dielectric layer, exposing the photoresist to a pattern of radiation, and then developing the pattern into the photoresist utilizing a resist developer. Once the patterning of the photoresist is completed, the sections of the gate stack covered by the photoresist are protected to provide the first and second gate structures 20a, 20b, while the exposed regions are removed using a selective etching process that removes the unprotected regions. Following etching, the remaining portions of the at least one dielectric layer provide the first and second gate dielectrics 21a, 21b of the first and second gate structures 20a, 20b, and the remaining portions of the at least one gate conductor provide the first and second gate conductors 22a, 22b of the first and second gate structures 20a, 20b. Following formation of the first and second gate structures 20a, 20b, the photoresist may be removed.

In other embodiments, the first and second gate structures 20a, 20b may be independently processed. For example, a first block mask, such as a photoresist mask, may be formed over the second conductivity region 15, while the material layers for the at least one first gate dielectric 21a and the at least one gate conductor 22b are deposited and patterned within the first conductivity region 10 to form the first gate structure 20a. Thereafter, the first block mask is removed, and a second block mask is formed over the second conductivity region 15. Material layers for the at least one second gate dielectric 21b and the at least one second gate conductor 22b are then deposited, patterned and etched in the second conductivity region 15 to provide the second gate structure 20b. In this embodiment, different materials for the first gate structure 20a and the second gate structure 20b may be selected that provide a performance enhancement specific to the conductivity of the semiconductor device that is formed in the first and second conductivity regions 10, 15. For example, the first gate structure 20a may be processed to include at least one first gate conductor 22a composed of a metal having a work function suitable for p-type semiconductor devices, and the second gate structure 20b may be processed to include at least one second gate conductor 22b composed of a metal having a work function suitable for n-type semiconductor devices.

A spacer 16a, 16b, may be formed on each of the first and second gate structures 20a, 20b. The spacer 16a, 16b is typically composed of a dielectric material, such as an oxide, nitride or oxynitride. The spacer 16a, 16b may be formed using deposition, photolithography and etching process.

FIG. 5 depicts one embodiment of forming a first source region 30a and a first drain region 35a in the first conductivity region 10 of the substrate 5. In one embodiment, the first source region 30a and the first drain region 35a may be doped with a p-type dopant. In some embodiments, at least one of the first source region 30a and the first drain region 30b may be doped with an n-type dopant. The term "p-type" refers to the addition of impurities to an intrinsic semiconductor that creates deficiencies of valence electrons. In a silicon-containing substrate, examples of p-type dopants, i.e., impurities, include but are not limited to boron, aluminum, gallium and indium. "N-type" refers to the addition of impurities that contributes free electrons to an intrinsic semiconductor. In a silicon containing substrate examples of n-type dopants, i.e., impurities, include but are not limited to antimony, arsenic and phosphorous.

In one example, the first source region 30a and the first drain region 35a may be formed by ion implanting a p-type dopant into the first conductivity region 10 of the substrate 5. During the ion implantation steps for forming the first source region 30a and the first drain region 35a, the second conductivity region 15 of the substrate 5 may be protected from being implanted with the dopant that forms the first source region 30a and the first drain region 35a by a block mask. More specifically, prior to ion implantation of the dopant for the first source region 30a and the first drain region 35a, a block mask (not shown) may be formed overlying the second conductivity region 15 of the substrate 5, in which the block mask leaves the first conductivity region 10 of the substrate 5 exposed. The block mask may be composed of a photoresist material or may be composed of a hard mask material, such as silicon oxide or silicon nitride, that may be removed selectively to the underlying structure. The exposed portion, i.e., first conductivity region 10, of the substrate 5 that includes the relaxed semiconductor portion 4a that is in the unstrained state is not protected by the block mask, and is ion implanted to provide the p-type first source and drain regions 30a, 35a, while the second conductivity region 15 of the substrate 5 is protected by the block mask.

In one embodiment, when forming first source and drain regions 30a, 35a having a p-type conductivity, a typical dopant species is boron or $BF_2$. Boron may be implanted utilizing implant energies ranging from 0.2 keV to 3.0 keV with an implant dose ranging from $5\times10^{14}$ atoms/cm$^2$ to $5\times10^{15}$ atoms/cm$^2$. $BF_2$ may be implanted utilizing implant energies ranging from 1.0 keV to 15.0 keV and a dose ranging from $5\times10^{14}$ atoms/cm$^2$ to $5\times10^{15}$ atoms/cm$^2$. The concentration of the p-type dopant in the first source and drain regions 30a, 35a may range from $1\times10^{18}$ atoms/cm$^3$ to $8\times10^{21}$ atoms/cm$^3$. In another embodiment, the dopant concentration of the p-type dopant in the first source region 30a and the first drain region 35a ranges from $1\times10^{19}$ atoms/cm$^3$ to $3\times10^{20}$ atoms/cm$^3$. Following formation of the first source and drain regions 30a, 35a, the block mask that is present over the second conductivity region 10 of the substrate 5 is removed. A block mask may then be formed over the first conductivity region 10, and a second source region 30b and a second drain region 35b may be formed in the second conductivity region 15.

FIG. 5 depicts one embodiment of forming a second source region 30b and a second drain region 35b in the second conductivity region 15 of the substrate 5. The second source region 30b and the second drain region 35b may be formed using ion implantation and may be doped to an n-type conductivity. In some embodiments, at least one of the second source region 30b and the second drain region 35b may be doped with a dopant having a p-type conductivity. N-type source region and drain regions are typically produced with group V elements. A typical implant for the n-type regions is arsenic. The n-type regions can be implanted with arsenic using an energy of about 10 keV to 50 keV with a dose of $5\times10^{14}$ atoms/cm$^2$ to $5\times10^{15}$ atoms/cm$^2$. The first and second source regions 30a, 30b and first and second drain regions 35a, 35b may then be activated using a thermal activation anneal. Examples of thermal activation anneals include rapid thermal anneal, also referred to as rapid thermal processing, and furnace annealing. The first and second source regions 30a, 30b and drain regions 35a, 35b may also be activated using laser annealing.

In the embodiment depicted in FIG. 5, the laterally relaxed semiconductor portion 4a is in a neutral strain state and the uniaxially strained semiconductor portion 4b has a tensile strain. It has been determined that a tensile strain increases carrier mobility in n-type semiconductor devices, but also decreases carrier mobility in p-type semiconductor devices. In this embodiment, the first conductivity region may be processed to provide a p-type semiconductor device, such as a p-type field effect transistor (pFET), and the second conductivity region 15 may be processed to provide an n-type semiconductor device, such as an n-type field effect transistor (nFET).

FIGS. 6A-9 depict another embodiment of the present disclosure, in which a semiconductor device 100a' is formed on a strained semiconductor layer 11 that is formed atop the relaxed semiconductor portion 4a, i.e., relaxed semiconductor layer, that is in an unstrained state. In one embodiment, the method may include providing an SSDOI substrate 5 including a biaxially strained semiconductor layer 4 of a first composition that is present directly on a dielectric layer 3, as described above with reference to FIGS. 1A and 1B. The biaxial strained semiconductor layer 4 may then be patterned and etched to provide a first conductivity region 10 of a laterally relaxed semiconductor portion 4a and a second conductivity region 15 of a biaxial strained semiconductor portion 4b, as described above with reference to FIGS. 2A-2C.

In one embodiment, the laterally relaxed semiconductor portion 4a is present suspended over an undercut region 7 in the dielectric layer 3, in which anchor portions 6 of the dielectric layer 3 are in direct contact with end portions of the laterally relaxed semiconductor portion 4a. A hydrogen anneal is then applied to the first and second conductivity region 10, 15, wherein the laterally relaxed semiconductor portion 4a is relaxed to an unstrained state, i.e., to a unstrained semiconductor layer, in which the biaxial strained semiconductor portion 4b in the second conductivity region 15 remains strained, as described above with reference to FIGS. 3A and 3B. The undercut region 7 may then be filled with a dielectric material 8, as described above with reference to FIGS. 4A-4C.

Figure 6B:
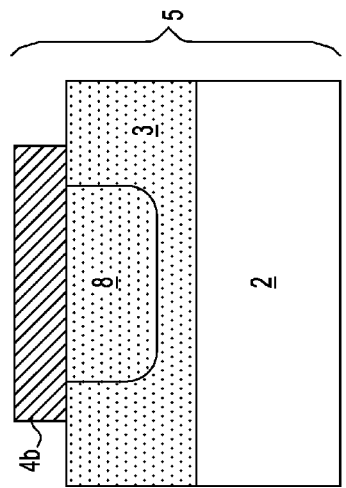
FIG. 6B is a side cross-sectional view along section line A-A' in FIG. 6A.
Figure 6A:
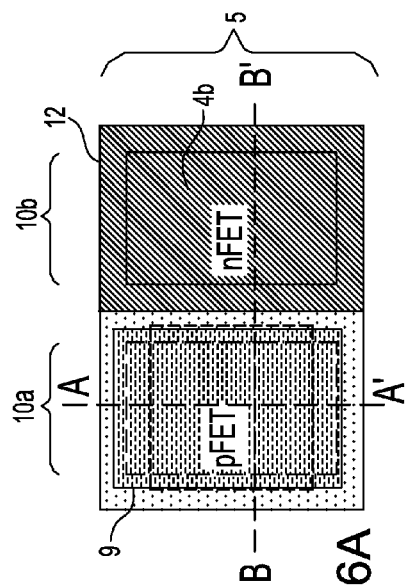
FIG. 6A is a top down view of an initial process step of another embodiment of the present disclosure, in which a strained semiconductor layer of a second composition is formed on the unstrained semiconductor layer of a first composition beginning on the structure depicted in FIGS. 4A-4C.

Referring to FIGS. 6A-6C, in some embodiments forming the strained semiconductor layer 11 may begin with depositing a second composition semiconductor layer 9 on the unstrained semiconductor layer 4a that is depicted in FIGS. 4A-4C. The composition of the second composition semiconductor material 9 may be selected to convert the unstrained semiconductor layer 4a to a material having an intrinsic compressive strain. The second composition semiconductor material 9 may be selected to have a lattice dimension that is greater than the unstrained semiconductor layer 4a. For example, when the unstrained semiconductor layer 4a is composed of silicon (Si), the second composition semiconductor material 9 may be a germanium (Ge) containing material. In some embodiments, the germanium (Ge) content of the second composition semiconductor material 9 may be greater than 20 wt. %. In other embodiments, the second composition semiconductor material 9 may have a germanium (Ge) content that ranges from 20 wt. % to 100 wt. %. In one example, the second composition semiconductor material 9 may be pure germanium (Ge).

In one embodiment, forming the second composition semiconductor material 9 over the unstrained semiconductor layer 4a includes epitaxially deposition/epitaxial growth. "Epitaxial growth and/or deposition" means the growth of a semiconductor material on a deposition surface of a semiconductor material, in which the semiconductor material being grown has substantially the same crystalline characteristics as the semiconductor material of the deposition surface. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, an epitaxial film deposited on a {100} crystal surface will take on a {100} orientation.

A number of different sources may be used for the deposition of epitaxial silicon germanium (SiGe). In some embodiments, the gas source for the deposition of epitaxial SiGe may include a mixture of silicon containing gas sources and germanium containing gas sources. For example, an epitaxial layer of silicon germanium may be deposited from the combination of a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof, and a germanium gas source that is selected from the group consisting of germane, digermane, halogermane, dichlorogermane, trichlorogermane, tetrachlorogermane and combinations thereof. The temperature for epitaxial silicon germanium deposition typically ranges from 550° C. to 900° C. Although higher temperature typically results in faster deposition, the faster deposition may result in crystal defects and film cracking.

In some embodiments, before forming the second composition semiconductor material 9 on the unstrained semiconductor layer 4a that is present in the first conductivity region 10, a block mask 12 may be formed over the second conductivity region 15. The block mask 12 may be a soft mask, such as a photoresist mask, or the block mask 12 may be a hard mask. Some examples of materials suitable for the hard masks are dielectrics, such as oxides, nitrides or oxynitrides. For example, when the block mask 12 is a hard mask of an oxide, the block mask 12 may be composed of silicon oxide. In some embodiments, epitaxial growth of the second composition semiconductor material 9, e.g., silicon germanium (SiGe), is preferential, wherein the second composition semiconductor material 9 is not formed on dielectrics, such as the block mask 12. In one embodiment, the thickness of the second composition semiconductor material 9 may range from 2 nm to 40 nm, as measured from the upper surface of the unstrained semiconductor layer 4a of the first composition semiconductor material. In another embodiment, the thickness of the second composition semiconductor material 9 may range from 3 nm to 10 nm.

FIG. 7 depicts one embodiment of the structure illustrated in FIG. 6A following a condensation process to intermix the second composition semiconductor material 9 with the unstrained semiconductor layer 4a of the first composition to provide the strained semiconductor layer 11. In some embodiments, the intermixing of the second composition semiconductor material 9 with the unstrained semiconductor layer 4a of the first composition semiconductor material comprises thermal annealing. In one embodiment, the thermal annealing that intermixes the second composition semiconductor material 9 with the unstrained semiconductor layer 4a of the first composition semiconductor comprise an annealing process selected from the group consisting of rapid thermal annealing (RTA), flash lamp annealing, furnace annealing, laser annealing and combinations thereof. In one embodiment, the thermal annealing for intermixing the second composition semiconductor material 9 with the unstrained semiconductor layer 4a of the first composition semiconductor material may include a temperature ranging from 800° C. to 1200° C., and a time period ranging from 10 milliseconds to 100 seconds.

In one embodiment, the intermixing of the second composition semiconductor material 9 and the unstrained semiconductor layer 4a of the silicon first composition semiconductor material produces a strained semiconductor layer 11 of a third composition semiconductor material of silicon germanium (SiGe) having an intrinsic compressive strain. The thickness of the strained semiconductor layer 11 of the third composition semiconductor material of silicon germanium (SiGe) may range from 3 nm to 20 nm. In another embodiment, the thickness of THE strained semiconductor layer 11 of the third composition semiconductor material of silicon germanium (SiGe) may range from 3 nm to 10 nm.

A lower section of the strained semiconductor layer 11 of the third composition semiconductor material may be in direct contact with the upper surface of the dielectric layer 3 in the first conductivity region 10. The lower section of the strained semiconductor layer 11 of the third composition semiconductor material may have a germanium (Ge) content ranging from 10 wt. % to 90 wt %. In another embodiment, the lower section of the strained semiconductor layer 11 may have a germanium (Ge) content ranging from 20 wt. % to 40 wt %. The upper section of the strained semiconductor layer 11 of the third composition semiconductor material may have a germanium (Ge) content ranging from 10 wt. % to 90 wt %. In another embodiment, the upper section of the layer of the third composition semiconductor material of the second strained semiconductor layer 11 may have a germanium (Ge) content ranging from 20 wt. % to 40 wt %.

Figure 8C:
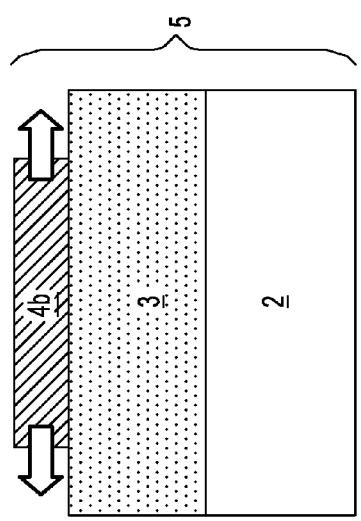
FIG. 8C is a side cross-sectional view along section line B-B' in FIG. 8A.
Figure 8D:
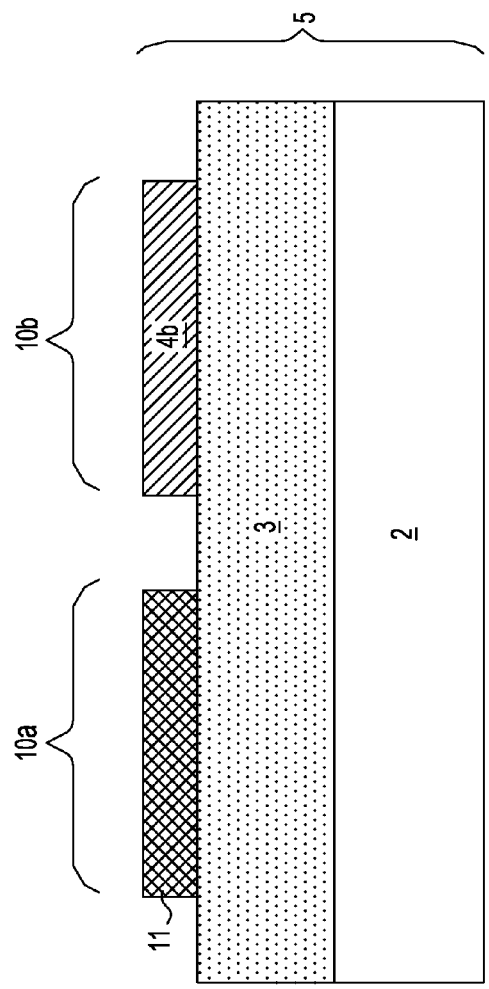
FIG. 8D is a side cross-sectional view along section line C-C' in FIG. 8A.

FIGS. 8A-8C depict removing an oxide layer 13 that is formed during the condensation process depicted in FIG. 7. Oxidation of the upper surface of the strained semiconductor layer 11 may occur during or after the process steps for intermixing the unstrained semiconductor layer 4a of the first composition semiconductor material and the second composition semiconductor layer 9 that are described above with reference to FIG. 7. For example, and in one embodiment in which an oxide layer 13 is formed on the upper surface of the strained semiconductor layer 11 while intermixing the relaxed islands 4a of the first composition semiconductor material and the second composition semiconductor material 8, the thermal processing that causes diffusion of the germanium (Ge) atoms from the second composition semiconductor material 9 of silicon germanium into the unstrained semiconductor layer 4a of silicon (Si) is performed in an oxygen-containing atmosphere. The application of the oxygen containing atmosphere forms the oxide, e.g., silicon oxide ($SiO_2$), on the upper surface of the strained semiconductor layer 11. In another embodiment, the oxide layer 13 is formed by applying a thermal anneal in an oxygen containing atmosphere after the formation of the strained semiconductor layer 11. In each of these cases, silicon (Si) atoms from the silicon germanium (SiGe) layer of the second composition semiconductor material are preferentially oxidized. The oxide layer 13 may be silicon oxide ($SiO_2$), and may have a thickness ranging from 10 nm to 100 nm. In another embodiment, the oxide layer 13 may be silicon oxide ($SiO_2$), and may have a thickness ranging from 20 nm to 50 nm. In some embodiments, the oxide layer 13 is removed by an etch process that is selective to the strained semiconductor layer 11 and the block mask 12. The etch process may be a wet or dry etch. Following removal of the oxide layer 13, the block mask 12 may also be removed.

Figure 9:
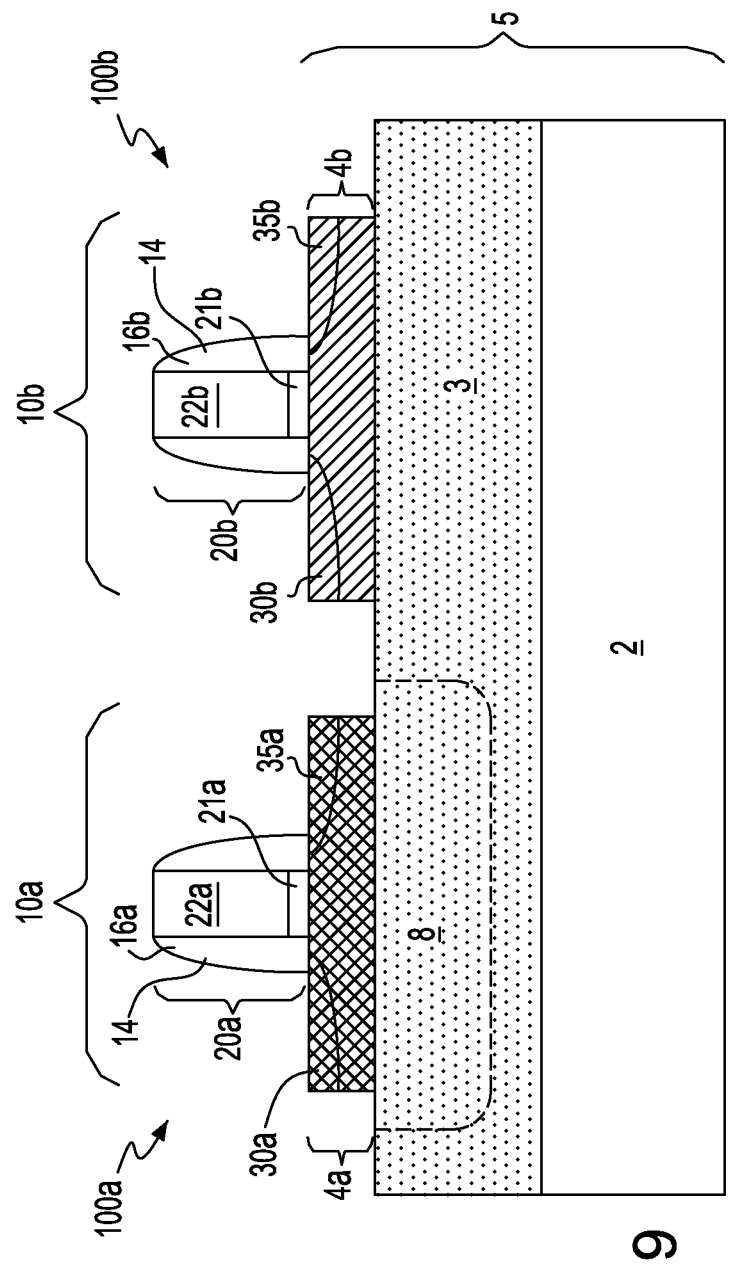
FIG. 9 is a side cross-sectional view depicting forming a first semiconductor device of a first conductivity in the first conductivity region and forming a second semiconductor device of a second conductivity in the second conductivity region of the structure depicted in FIGS. 8A-8C, in accordance with one embodiment of the present disclosure.

FIG. 9 depicts forming a first semiconductor device 100a' of a first conductivity in the first conductivity region 10 and forming a second semiconductor device 100b of a second conductivity in the second conductivity region 15 of the structure depicted in FIGS. 8A-8C. The first semiconductor device 100a' and the second semiconductor device 100b that are depicted in FIG. 9 are similar to the first and second semiconductor devices 100a, 100b depicted in FIG. 5. Therefore, the description of the gate structures 20a, 20b, the first and second source regions 30a, 30b, and the first and second drain regions 35a, 35b that are depicted in FIG. 5 is suitable for the gate structures 20a, 20b, the first and second source regions 30a, 30b, the first and second drain regions 35a, 35b that are depicted in FIG. 9.

In the embodiment depicted in FIGS. 6A-9, the strained semiconductor layer 11 may be composed of silicon germanium and may have a compressive strain. In one embodiment, the compressive strain that is present in the strained semiconductor layer 11 may range from 500 MPa to 4000 MPa. In another embodiment, the compressive strain that is present in the strained semiconductor layer 11 may range from 1000 MPa to 2500 MPA. The compressive strain present in the strained semiconductor layer 11 may increase device performance, i.e., carrier mobility, for p-type semiconductor devices. In some embodiments, the semiconductor device 100a' formed in the first conductivity region 10 may be a p-type semiconductor device, such as a p-type field effect transistor. The uniaxially strained semiconductor layer 4b that is present in the second conductivity region may be composed of silicon having a tensile strain. In one embodiment, the tensile strain that is present in the uniaxially strained semiconductor layer 4b may range from 500 MPa to 4000 MPa. In another embodiment, the tensile strain that is present in the uniaxially strained semiconductor layer 4b may range from 1000 MPa to 2500 MPA. The tensile strain present in the uniaxially strained semiconductor layer 4b may increase device performance, i.e., carrier mobility, for n-type semiconductor devices. In some embodiments, the semiconductor device 100b formed in the second conductivity region 15 may be an n-type semiconductor device, such as an n-type field effect transistor.

FIGS. 10A-13 depict one embodiment of a method of forming finFET semiconductor devices 200a, 200b. The first finFET semiconductor device 200a that is formed in the first conductivity region 10 is typically a p-type semiconductor device, and the second finFET semiconductor device 200b in the second conductivity region 15 is typically an n-type semiconductor device. Different from a "planar" semiconductor device as depicted in FIGS. 1-9, a finFET semiconductor device includes a fin structure that includes the channel region of the device. As used herein, the term "fin structure" refers to a semiconductor material, which is employed as the body of a semiconductor device, in which the gate structure is positioned around the fin structure such that charge flows down the channel on the two sidewalls of the fin structure and optionally along the top surface of the fin structure. The method that is illustrated in FIGS. 10A-13 may begin with the SSDOI substrate 5 that is depicted in FIGS. 1A and 1B, in which a biaxially strained semiconductor layer 4 is in direct contact with a dielectric layer 3.

Figure 10A:
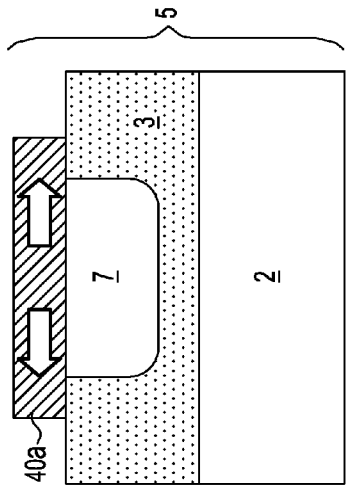
FIG. 10A is a top down view depicting one embodiment of patterning the biaxially strained semiconductor layer to provide uniaxially strained fin structures and forming an undercut region in the dielectric layer under the portion of the fin structures that are present in a first conductivity region of the substrate.
Figure 10B:
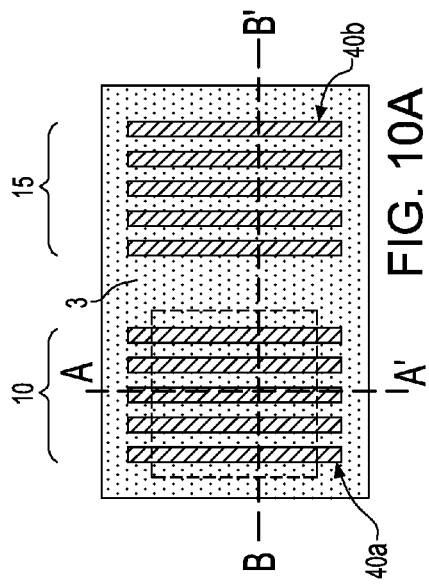
FIG. 10B is a side cross-sectional view along section line A-A' of FIG. 10A.
Figure 10C:
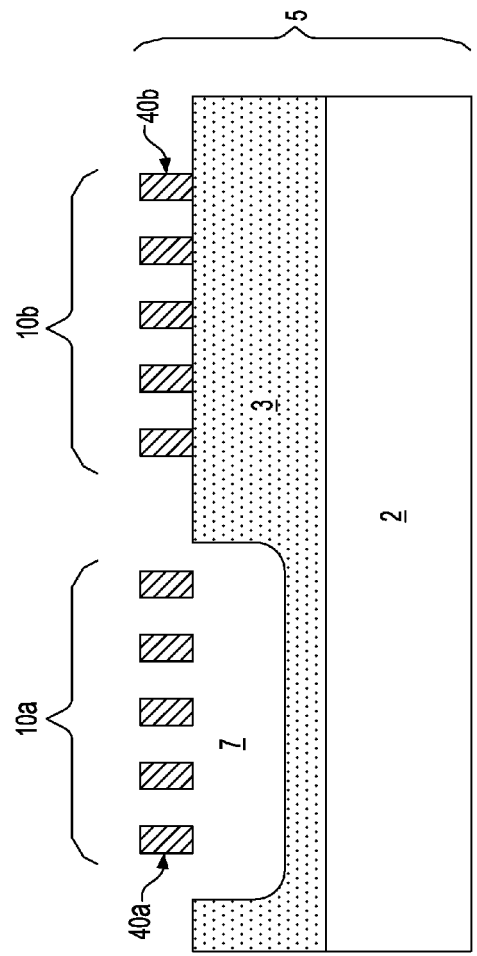
FIG. 10C is a side cross-sectional view along section line B-B' of FIG. 10A.

FIGS. 10A-10C depict patterning the biaxial strained semiconductor layer 4 to provide uniaxially strained fin structures 40a and forming an undercut region 7 in the dielectric layer 3 under the portion of the uniaxially strained fin structures 40a that are present in a first conductivity region 10 of the SSDOI substrate 5. In some embodiments, patterning the biaxially strained semiconductor layer 4 to provide the laterally relaxed semiconductor fin structures 40a and the uniaxially strained semiconductor fin structures 40b includes forming a first etch mask (not shown) over the first conductivity region 10 and the second conductivity region 15 on the biaxially strained semiconductor layer 4, and etching the biaxially strained semiconductor layer 4 selectively to the first etch mask and the dielectric layer 3 to form fin structures 40a, 40b. In some embodiments, the etching of the biaxially strained semiconductor layer 4 forms the uniaxially strained semiconductor fin structures 4b in the second conductivity device region 15 and another set of uniaxially strained semiconductor fin structures (which is subsequently processed to provide the laterally relaxed fin structures 40a) in the first device region 10. After the fin structures 40a, 40b are formed, the first etch mask may be removed. The first etch mask used to form the fin structures 40a, 40b is similar to the etch masks that are described above with reference to FIGS. 2A-2C.

Each of the fin structures 40a, 40b may have a height ranging from 5 nm to 200 nm. In one embodiment, each of the fin structures 40a, 40b may have height ranging from 10 nm to 100 nm. In another embodiment, each of the fin structures 40a, 40b may have a height ranging from 15 nm to 50 nm. Each of the fin structures 40a, 40b may have a width ranging from 5 nm to 50 nm. In another embodiment, each of the fin structures 40a, 40b may have width ranging from 8 nm to 20 nm. Adjacent fin structures 40a, 40b may be separated by a pitch ranging from 20 nm to 100 nm. In one embodiment, adjacent fin structures 40a, 40b may be separated by a pitch ranging from 30 nm to 50 nm. In some embodiments, each of the fin structures 40a, 40b may include a dielectric cap (not shown) that is present on the upper surface of each of the fin structures 40a, 40b. The dielectric cap may be an oxide, nitride or oxynitride material. For example, the dielectric cap may be composed of silicon oxide or silicon nitride.

FIGS. 10A-10C further depict forming an undercut region 7 in the dielectric layer 3 that is underlying the laterally relaxed semiconductor fin structures 4a in the first conductivity region 10 of the semiconductor substrate 5. In some embodiments, forming the undercut region may begin with applying a second etch mask (not shown), over the second conductivity region 15 and anchor portions of the uniaxially strained semiconductor fin structures in the first conductivity region 10. In some embodiments, the uniaxially strained semiconductor fin structures (which are subsequently processed to provide the laterally relaxed fin structures 40a) that are present in the first conductivity region 10 are relaxed by forming the undercut region 7 and applying the subsequently described hydrogen anneal. This reduces the strain in the uniaxial strained fins structures 40a in the first conductivity region 10 to a neutral strain state. Following forming of the second etch mask, an undercut etch is applied to portions of the dielectric layer 3 that are not covered by the second etch mask, wherein the undercut etch removes material of the dielectric layer 3 selectively to the uniaxially strained semiconductor fin structures (subsequently processed to provide the laterally relaxed fin structures 40a that are in an unstrained state) that are present in the first conductivity region 10 to form the undercut region 7. The undercut etch that is depicted in FIGS. 10A-10C is similar to the undercut etch that is described above with reference to FIGS. 2A-2C. Therefore, the description of the undercut etch depicted in FIGS. 2A-2C is suitable for the undercut etch that provides the structure depicted in FIGS. 10A-10C.

Figure 11A:
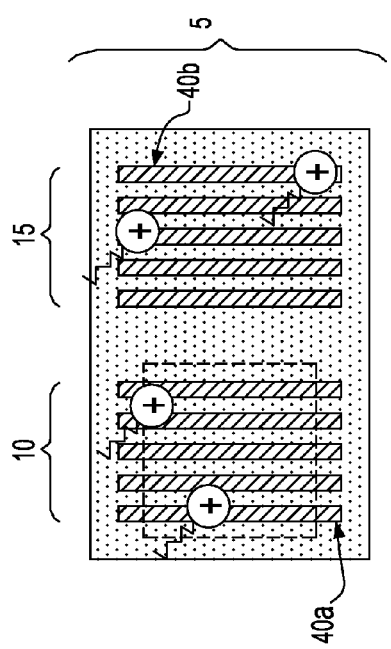
FIG. 11A is a top down view depicting one embodiment of a hydrogen anneal being applied to the first and second conductivity region of the structure depicted in FIG. 10A, wherein the uniaxially strained semiconductor fin structures in the first conductivity region are relaxed to an unstrained state and the uniaxially strained semiconductor fin structures in the second conductivity region remains strained.
Figure 11B:
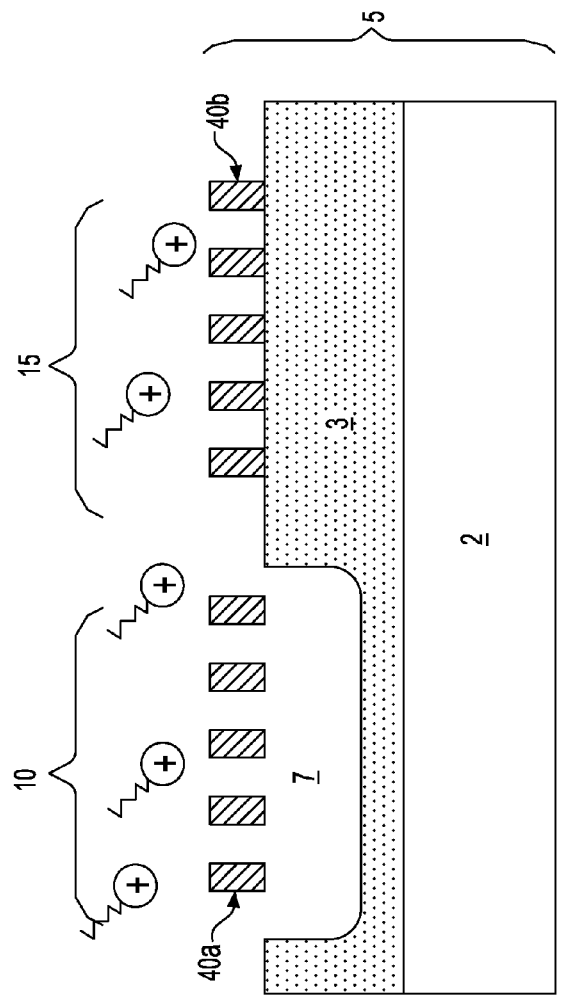
FIG. 11B is a side cross-sectional view along section line A-A' of FIG. 11A.

FIGS. 11A and 11B depict one embodiment of applying a hydrogen anneal to the first and second conductivity region 10, 15, wherein the laterally relaxed semiconductor fin structures 40a are relaxed to an unstrained state and the uniaxially strained semiconductor fin structures 40b in the second conductivity region remains strained. The hydrogen anneal that is depicted in FIGS. 11A and 11B is similar to the hydrogen anneal that is described above with reference to FIGS. 3A and 3B. Therefore, the above description of the hydrogen anneal referencing FIGS. 3A to 3B is suitable for the hydrogen anneal that is illustrated in FIGS. 11A and 11B. Following the hydrogen anneal the laterally relaxed fin structures 40a are in an unstrained state. The uniaxially strained semiconductor fin structures 40b that are present in the second conductivity region 15 are not relaxed by the hydrogen anneal. The uniaxially strained semiconductor fin structures 40b are typically in a tensile strain. In one embodiment, the strain that is present in the uniaxially strained semiconductor fin structures 40b following the hydrogen anneal may range from 200 MPa to 4 GPa. In another embodiment, the strain that is present in the uniaxially strained semiconductor fin structures 40b following the hydrogen anneal may range from 1 GPa to 4 GPa.

Figure 12B:
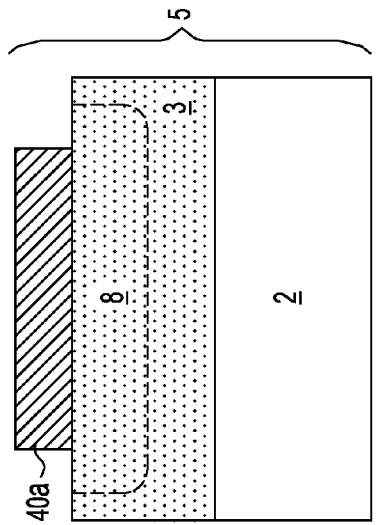
FIG. 12B is a side cross-sectional view along section line A-A' in FIG. 12A.
Figure 12C:
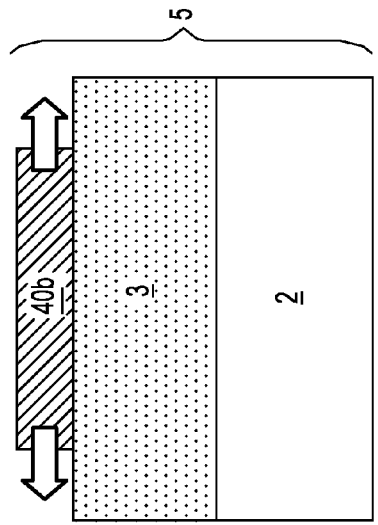
FIG. 12C is a side cross-sectional view along section line B-B' in FIG. 12A.
Figure 12A:
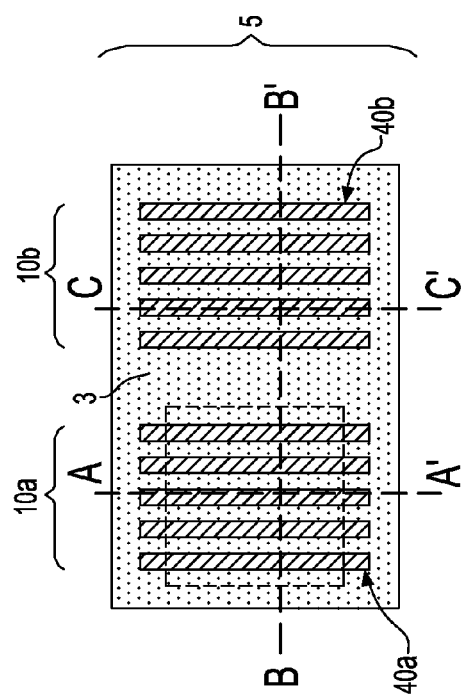
FIG. 12A is a top down view depicting filling the undercut region with a dielectric material, in accordance with one embodiment of the present disclosure.
Figure 12D:
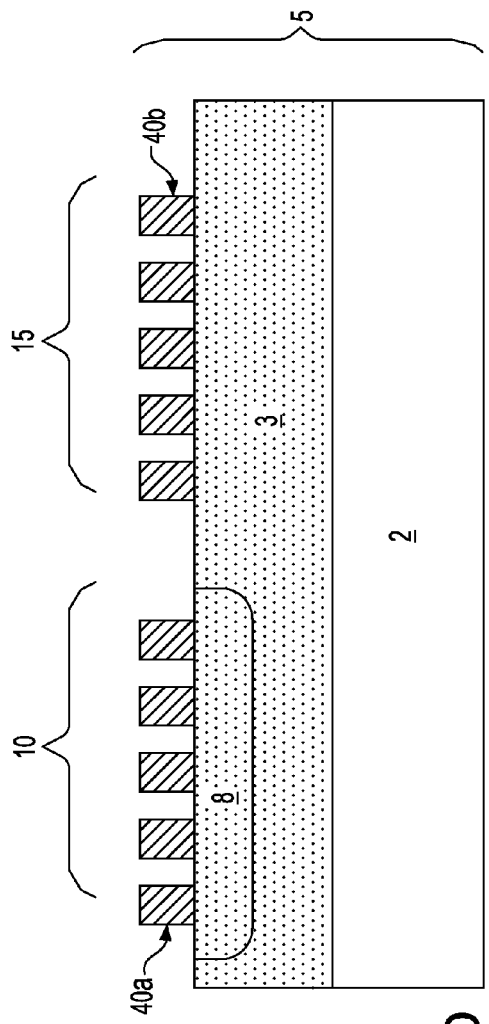
FIG. 12D is a side cross-sectional view along section line C-C' in FIG. 12A.

FIGS. 12A-12D depict filling the undercut region 7 with a dielectric material 8. The step of filling the undercut region 7 with the dielectric material 8 that is depicted in FIGS. 12A-12D is similar to the step of filling the undercut region 7 with the dielectric material 8 that is depicted in FIGS. 4A-4C. Therefore, the description of the dielectric fill and the dielectric material 8 that are described above with reference to FIGS. 4A-4C is suitable for the dielectric fill and the dielectric material that are depicted in FIGS. 12A-12C.

Figure 13:
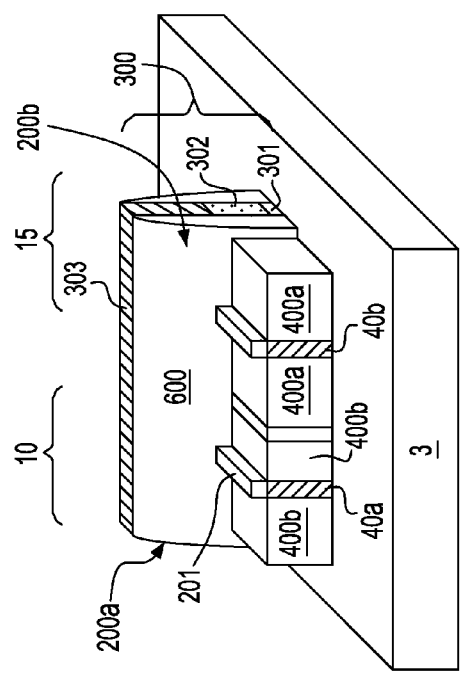
FIG. 13 is a perspective view depicting forming a first finFET semiconductor device of a first conductivity in the first conductivity region and forming a second finFET semiconductor device of a second conductivity in the second conductivity region of the structure depicted in FIGS. 12A-12D, in accordance with one embodiment of the present disclosure.

FIG. 13 depict one embodiment of forming a first finFET semiconductor device 200a of a first conductivity in the first conductivity region 10 and forming a second finFET semiconductor device 200b of a second conductivity in the second conductivity region 15 of the structure depicted in FIGS. 12A-12D. Each of the fin field effect transistors (finFETs) 200a, 200b may be formed using similar processing as the planar field effect transistors (FETs) 100a, 100b that are described above with reference to FIG. 5. In one embodiment, p-type fin field effect transistors (p-type finFETs) 200a are formed on the relaxed fin structures 40a. In one embodiment, n-type fin field effect transistors (n-type finFETs) are formed on uniaxially strained semiconductor fin structures 40b that are present in the second conductivity region, when the uniaxially strained semiconductor fin structures 40b has a tensile strain. Although FIG. 13 only depicts one p-type finFET 200a in the first conductivity region 10 and only one n-type finFET 200b in the second conductivity 15, multiple p-type finFETs may be present in the first conductivity region 10 and multiple n-type finFETS may be present in the second conductivity region 15.

Referring to FIG. 13, one difference between the processing for forming the planar field effect transistors (FETs) 100a, 100b, and the fin field effect transistors (finFETs) 200a, 200b is that the process sequence for forming the fin field effect transistors (finFETs) 200a, 200b typically incorporates the channel region of the finFET semiconductor devices within the fin structure. In some embodiments, a gate structure 300 including at least one gate dielectric 301 and at least one gate conductor 302 is formed on the channel portions of the fin structures 40a, 40b. The gates structure 300 may be formed using deposition, photolithography and etch processes similar to those described above for forming the gates structures 20a, 20b described above with reference to FIG. 5. Although FIG. 13 depicts a single gate structure being formed to both the p-type and n-type finFETs 200a, 200b, embodiments have been contemplated in which a separate gate structure is formed for each of the p-type and n-type finFETs 200a, 200b. In some embodiments, block masks may be employed to independently process the gate structures to each of the n-type and p-type finFETs 200a, 200b. A spacer 600 may be formed on the sidewall of the gate structure 300 using deposition, photolithography and etch processes.

In some embodiments, the source and drain regions 400a, 400b are formed on opposing sides of the gate structure 300 for each of the p-type and n-type finFETs 200a, 200b. In some embodiments, the source and drain regions 400a, 400b include extension regions and epitaxially formed portions. In some examples, following the formation of the dielectric spacer 600, the exposed portions of the relaxed fin structures 40a and the uniaxially strained fin structures 40b may be doped to provide source and drain extension regions. The source and drain extension regions may be doped to an n-type or p-type conductivity by ion implantation. The above description of forming the first and second source regions 30a, 35a and the first and second drain regions 35a, 35b that are depicted in FIG. 5 may be suitable to describe the formation of the source and drain extension regions that are formed in the relaxed fin structures 40a and the uniaxially strained fin structures 40b that are depicted in FIG. 13. The source and drain extensions regions in the relaxed fin structures 40a within the first conductivity region 10 may be formed by ion implantation with p-type conductivity dopants. The source and drain extensions regions in the uniaxially strained fin structures 40b within the second conductivity region 15 may be formed by ion implantation with n-type conductivity dopants. Block masks may be employed to allow for the source and drain extension regions to be independently formed.

Following formation of the source and drain extension regions, an epitaxial source region and an epitaxial drain region may be formed on the portions of the relaxed fin structures 40a and the unilaterally strained fin structures 40b including the source and drain extension regions. In some embodiments, the epitaxial source region and the epitaxial drain region may be composed of the same material as the fin structures. In other embodiments, the epitaxial source and drain regions may be composed of a different semiconductor material than the source and drain regions. For example, the epitaxial source and drain regions may be composed of silicon germanium when the semiconductor device is a p-type finFET, and the epitaxial source and drain regions may be composed of silicon doped with carbon (Si:C) when the semiconductor device is an n-type finFET. The dopant that provides the conductivity type of the epitaxial source and drain region may be introduced in-situ. By "in-situ" it is meant that the dopant is introduced to the epitaxial source and drain regions while they are being formed. The conductivity type of the epitaxial source and drain region typically is the same as the source and drain extension region that the epitaxial source and drain region is formed on.

The fin structures 40a, 40b depicted in FIG. 14 further include a fin cap 201. The fin cap 201 may be composed of a dielectric, such as silicon oxide or silicon nitride. The gate structure 300 may also include a gate cap 302, which can be a dielectric, such as silicon oxide or silicon nitride.

In the embodiment depicted in FIG. 13, the laterally relaxed fin structures 40a that have been relaxed to an unstrained state are in a neutral strain state and the uniaxially strained fin structures 40b have a tensile strain. It has been determined that a tensile strain increases carrier mobility in n-type semiconductor devices, but also decreases carrier mobility in p-type semiconductor devices. In this embodiment, the first conductivity region 10 may be processed to provide a p-type finFETS 200a, and the second conductivity region 15 may be processed to provide an n-type finFETs 200b.

Figure 14A:
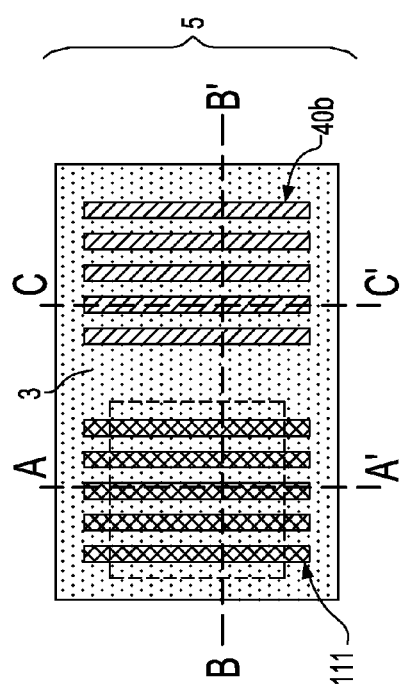
FIG. 14A is a top down view of another embodiment of the present disclosure, in which a strained semiconductor layer of a second composition is formed on the unstrained semiconductor layer of a first composition of the structure depicted in FIGS. 12A-12D.
Figure 14B:
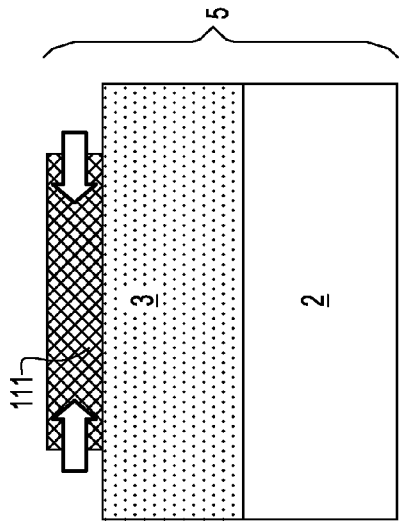
FIG. 14B is a side cross-sectional view along section line A-A' in FIG. 14A.
Figure 14C:
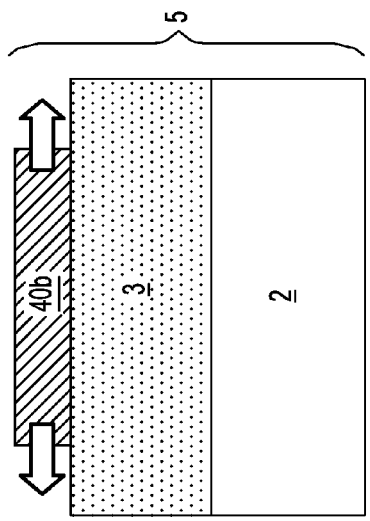
FIG. 14C is a side cross-sectional view along section line B-B' in FIG. 14A.
Figure 14D:
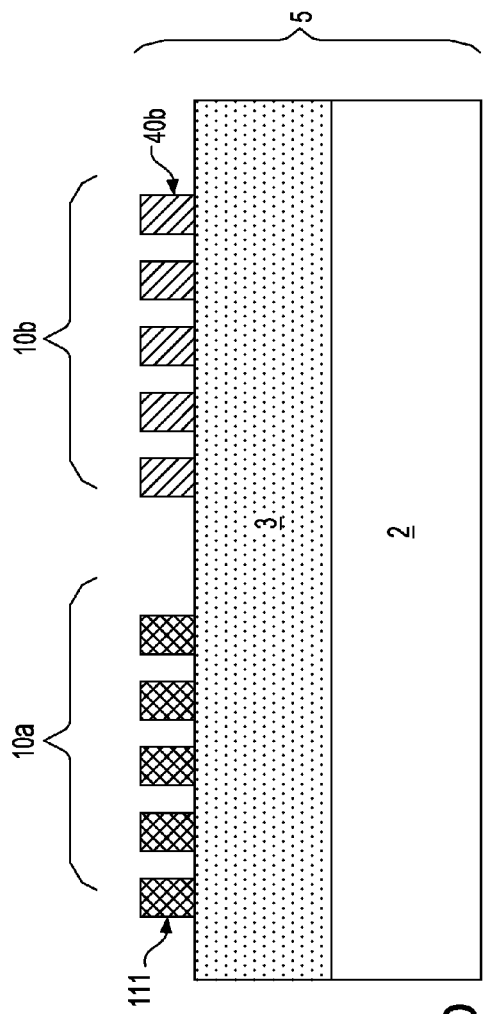
FIG. 14D is a side cross-sectional view along section line C-C' in FIG. 14A.
Figure 15:
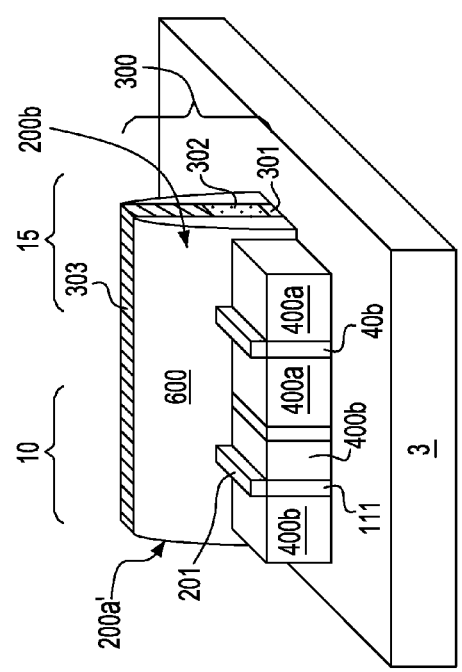
FIG. 15 is a perspective view depicting one embodiment of forming a first finFET semiconductor device of a first conductivity in the first conductivity region and forming a second finFET semiconductor device of a second conductivity in the second conductivity region of the structure depicted in FIGS. 14A-14C.

FIGS. 14A-15 depict another embodiment of the present disclosure, in which a finFET semiconductor device 200a' is formed on a strained fin structure 111 that is formed from the relaxed fin structures 40a that are described above in FIGS. 10A-13. In one embodiment, the method may begin with an SSDOI substrate 5 that has been patterned, etched and treated with a hydrogen anneal to provide a first conductivity region 10 including relaxed fin structures 40a and a second conductivity region 14 of uniaxially strained fin structures 40b. In one embodiment, the relaxed fin structures 40a are present over an undercut region 7 in the dielectric layer 3, in which anchor portions 6 of the dielectric layer 3 are in direct contact with end portions of the relaxed fin structures 40a. The undercut etch that provides the undercut region has been described above with reference to FIGS. 10A-10C. A hydrogen anneal is applied to the first and second conductivity region 10, 15, wherein the laterally relaxed semiconductor portion 40a is relaxed to an relaxed fin structure 40a and the uniaxial strained fin structure 40b in the second conductivity region 15 remains strained. The hydrogen anneal has been described above with reference to FIGS. 3A and 3B. The undercut region 7 may then be filled with a dielectric material 8. In some embodiments, the step of filling the undercut region 7 that is underlying the relaxed fin structures 40a with the dielectric material 8 has been described above with reference to FIGS. 12A-12C.

FIG. 14 depicts converting the relaxed fin structure 40a to a strained fin structure 111. In some embodiments, to convert the relaxed fin structure 40a to a strained fin structure 111, a strained layer of a second composition may be formed on the relaxed fin structure 40a followed by a condensation step. The process for converting the relaxed fins structure 40a to the strained fin structure 40a that are depicted in FIG. 14 is similar to the process for converting the unstrained semiconductor layer 4a to a strained semiconductor layer 4a that is described with reference to FIGS. 6A-8C. Therefore, the above description of converting the unstrained semiconductor layer 4a to the strained layer 11 is suitable for providing the description of converting the relaxed fins structure 40a to a strained relaxed structure 111. In some embodiments, the strained fin structure 111 may be composed of silicon germanium (SiGe) and may have an intrinsic compressive strain, which enhances the carrier mobility of p-type semiconductor devices, such as p-type finFETs. The uniaxially strained fin structure 40b may be composed of silicon (Si) having an intrinsic tensile strain, which enhances the carrier mobility of n-type semiconductor devices, such as n-type finFETs.

Referring to FIG. 15, in one embodiment, a p-type finFET 200a' is formed in the first conductivity region 10 on the strained fin structure 111 and an n-type finFET 200b is formed in the second conductivity region 15 on the uniaxially strained fin structure 40b. Although FIG. 15 only depicts one p-type finFET 200a' in the first conductivity region 10 and only one n-type finFET 200b in the second conductivity 15, multiple p-type finFETs may be present in the first conductivity region 10 and multiple n-type finFETS may be present in the second conductivity region 15. The description for forming the p-type finFET and the n-type finFET that are depicted in FIG. 13 is suitable for forming the p-type finFET and the n-type finFET that are depicted in FIG. 15.

FIGS. 1-15 depict methods of forming a semiconductor devices using a gate first process. In another embodiment, the process sequence for forming the semiconductor devices includes a gate last process sequence, which is not depicted in the supplied figures. A gate last process includes forming a replacement gate structure on the channel portion of the semiconductor device, forming a spacer on the sidewall of the replacement gate structure, forming source and drain regions on opposing sides of the replacement gate structure, removing the replacement gate structure, and forming a functional gate structure in the space once occupied by the replacement gate structure. The replacement gate structure can include sacrificial material that defines the geometry of a later formed functional gate structure that functions to switch the semiconductor device from an "on" to "off" state, and vice versa. A process sequence employing a replacement gate structure may be referred to as a "gate last" process sequence. Both gate first and gate last process sequences are applicable to the present disclosure.

While the present methods and structures have been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of forming a semiconductor device comprising:
   providing a substrate including a biaxially strained semiconductor layer present directly on a dielectric layer;
   patterning the biaxially strained semiconductor layer to provide a first conductivity region of a laterally relaxed semiconductor portion and a second conductivity region of a biaxially strained semiconductor portion, wherein the laterally relaxed semiconductor portion is present over an undercut region in the dielectric layer;
   applying a hydrogen anneal to the first and second conductivity regions, wherein the laterally relaxed semiconductor portion is relaxed to an unstrained state and the biaxial strained semiconductor portion in the second conductivity region remains strained;
   filling the undercut region with a dielectric material; and
   forming a first semiconductor device of a first conductivity in the first conductivity region and a second semiconductor device of a second conductivity in the second conductivity region.

2. The method of claim 1, wherein the substrate is a strained semiconductor directly on insulator (SSDOI) substrate, wherein the biaxially strained semiconductor layer has a tensile strain.

3. The method of claim 1, wherein the patterning the biaxially strained semiconductor layer to provide the first conductivity region and the second conductivity region comprises:
   forming a first etch mask over the first conductivity region and the second conductivity region of the biaxially strained semiconductor layer;
   etching the biaxially strained semiconductor layer selectively to the first etch mask and the dielectric layer;

applying a second etch mask over the second conductivity region and anchor portions of the biaxially strained semiconductor portion in the first conductivity regions; and applying an undercut etch to portions of the dielectric layer that are not covered by the second mask, wherein the undercut etch removes material of the dielectric layer selectively to the biaxially strained semiconductor portion to form the undercut region in the first conductivity region, wherein forming the undercut region relaxes the biaxially strained semiconductor portion into a uniaxially strained semiconductor portion.

4. The method of claim 3, wherein the applying of the hydrogen anneal to the uniaxially strained semiconductor portion provides that said laterally relaxed semiconductor portion is relaxed to said unstrained state.

5. The method of claim 1, wherein the applying of the hydrogen anneal to the first and second conductivity region comprises a temperature of about 800° C. or greater and a time period of 300 seconds or less.

6. The method of claim 1, wherein said filling the undercut region with the dielectric material comprises chemical vapor deposition, physical vapor deposition, or a combination thereof.

7. The method of claim 1, wherein said forming the first semiconductor device of the first conductivity in the first conductivity region and the second semiconductor device of the second conductivity in the second conductivity region comprises:
    forming a first gate structure in the first conductivity region and a second gate structure in the second conductivity region;
    forming first source regions and first drain regions of a p-type conductivity in the first conductivity region; and
    forming second source regions and second drain regions of an n-type conductivity in the second conductivity region.

8. A method of forming a semiconductor device comprising:
    providing a substrate including a biaxially strained semiconductor layer present directly on a dielectric layer;
    patterning the biaxially strained semiconductor layer to provide a first conductivity region of a laterally relaxed semiconductor fin structures and a second conductivity region of uniaxially strained semiconductor fin structures, wherein the laterally relaxed semiconductor fin structures are present over an undercut region in the dielectric layer;
    applying a hydrogen anneal to the first and second conductivity regions, wherein the laterally relaxed semiconductor fin structures are relaxed to an unstrained state and the uniaxially strained semiconductor fin structures in the second conductivity region remains strained;
    filling the undercut region with a dielectric material; and
    forming a first finFET semiconductor device of a first conductivity in the first conductivity region and a second finFET semiconductor device of a second conductivity in the second conductivity region.

9. The method of claim 8, wherein the substrate is a strained semiconductor directly on insulator (SSDOI) substrate, wherein the biaxially strained semiconductor layer has a tensile strain.

10. The method of claim 8, wherein the patterning the biaxially strained semiconductor layer to provide the laterally relaxed semiconductor fin structures and the uniaxially strained semiconductor fin structures comprises:

forming a first etch mask over the first conductivity region and the second conductivity region of the biaxially strained semiconductor layer; and etching the biaxially strained semiconductor layer selectively to the first etch mask and the dielectric layer to form fin structures, wherein the etching of the biaxially strained semiconductor layer forms the uniaxially strained semiconductor fin structures in the second conductivity region and another set of uniaxially strained semiconductor fin structures in the first conductivity region.

11. The method of claim 8, wherein forming the undercut region comprises:
    applying a second etch mask over the second conductivity region and anchor portions of said another set of the uniaxially strained semiconductor fin structures in the first device region; and
    applying an undercut etch to portions of the dielectric layer that are not covered by the second mask, wherein the undercut etch removes material of the dielectric layer selectively to said another set of the uniaxially strained semiconductor fin structures to form the undercut region in the first conductivity region.

12. The method of claim 11, wherein the applying of the hydrogen anneal to said another set of the uniaxially strained semiconductor fin structures provides that said another set of the uniaxially strained semiconductor fin structures are relaxed to said unstrained state.

13. The method of claim 8, wherein said forming the first finFET semiconductor device of the first conductivity in the first conductivity region and the second finFET semiconductor device of the second conductivity in the second conductivity region comprises:
    forming a first gate structure in the first conductivity region and a second gate structure in the second conductivity region;
    forming first source regions and first drain regions of a p-type conductivity in the first conductivity region; and
    forming second source regions and second drain regions of an n-type conductivity in the second conductivity region.

14. A method of forming a semiconductor device comprising:
    providing a substrate including a biaxially strained semiconductor layer of a first composition present directly on a dielectric layer;
    patterning the biaxially strained semiconductor layer to provide a first conductivity region of a laterally relaxed semiconductor portion and a second conductivity region of a biaxially strained semiconductor portion, the laterally relaxed semiconductor portion is present over an undercut region in the dielectric layer;
    applying a hydrogen anneal to the first and second conductivity region, wherein the laterally relaxed semiconductor portion is relaxed to an unstrained semiconductor layer and the biaxially strained semiconductor portion in the second conductivity region remains strained;
    filling the undercut region with a dielectric material;
    forming a strained semiconductor layer of a second composition on the unstrained semiconductor layer; and
    forming a first semiconductor device of a first conductivity in the first conductivity region and a second semiconductor device of a second conductivity in the second conductivity region.

15. The method of claim 14, wherein the substrate is a strained semiconductor directly on insulator (SSDOI) substrate, wherein the biaxially strained semiconductor layer has a tensile strain.

16. The method of claim 14, wherein the patterning the biaxially strained semiconductor layer to provide the first conductivity region and the second conductivity region comprises:
forming a first etch mask over the first conductivity region and the second conductivity region of the biaxially strained semiconductor layer;
etching the biaxially strained semiconductor layer selectively to the first etch mask and the dielectric layer;
applying a second etch mask over the second conductivity region and anchor portions of the biaxially strained semiconductor layer in the first conductivity region; and
applying an undercut etch to portions of the dielectric layer that are not covered by the second mask, wherein the undercut etch removes material of the dielectric layer selectively to the biaxially strained semiconductor layer to form the undercut region in the first conductivity region, wherein forming the undercut region relaxes the biaxially strained semiconductor layer into a uniaxially strained semiconductor layer.

17. The method of claim 14, wherein the unstrained semiconductor layer is a silicon layer, and said forming the strained semiconductor layer of the second composition on the unstrained semiconductor layer comprises epitaxially forming a germanium containing layer on the unstrained semiconductor layer.

18. The method of claim 17, wherein the germanium containing layer is a material selected from the group consisting of germanium, silicon germanium, silicon germanium doped with carbon, and a combination thereof.

19. The method of claim 14, wherein said forming the first semiconductor device of the first conductivity in the first conductivity region and the second semiconductor device of the second conductivity in the second conductivity region comprises:
forming a first gate structure in the first conductivity region and a second gate structure in the second conductivity region;
forming first source regions and first drain regions of a p-type conductivity in the first conductivity region; and
forming second source regions and second drain regions of an n-type conductivity in the second conductivity region.

20. A method of forming a semiconductor device comprising:
providing a substrate including a biaxially strained semiconductor layer of a first composition present directly on a dielectric layer;
patterning the biaxially strained semiconductor layer to provide a first conductivity region of laterally relaxed semiconductor fin structures and a second conductivity region of uniaxially strained semiconductor fin structures, wherein the laterally relaxed semiconductor fin structures are present over an undercut region in the dielectric layer;
applying a hydrogen anneal to the first and second conductivity region, wherein the laterally relaxed semiconductor fin structures are relaxed to a unstrained semiconductor fin structure, wherein the uniaxially strained semiconductor fin structures in the second conductivity region remain strained;
filling the undercut region with a dielectric material;
forming a strained semiconductor layer of a second composition on the unstrained semiconductor fin structures; and
forming a first finFET semiconductor device of a first conductivity in the first conductivity region and a second finFET semiconductor device of a second conductivity in the second conductivity region.

21. The method of claim 20, wherein the patterning the biaxially strained semiconductor layer to provide the laterally relaxed semiconductor fin structures and the uniaxially strained semiconductor fin structures comprises:
forming a first etch mask over the first conductivity region and the second conductivity region of the biaxially strained semiconductor layer; and
etching the biaxially strained semiconductor layer selectively to the first etch mask and the dielectric layer to form fin structures, wherein the etching of the biaxially strained semiconductor layer forms the uniaxially strained semiconductor fin structures in the second conductivity region and another set of uniaxially strained semiconductor fin structures in the first conductivity region.

22. The method of claim 20, wherein forming the undercut region comprises:
applying a second etch mask over the second conductivity region and anchor portions of said another set of the uniaxially strained semiconductor fin structures in the first device region; and
applying an undercut etch to portions of the dielectric layer that are not covered by the second mask, wherein the undercut etch removes material of the dielectric layer selectively to said another set of the uniaxially strained semiconductor fin structures to form the undercut region in the first conductivity region.

23. The method of claim 20, wherein the unstrained semiconductor layer is a silicon layer, and said forming the strained semiconductor layer of the second composition on the unstrained semiconductor layer comprises epitaxially forming a germanium containing layer on the unstrained semiconductor layer.

24. The method of claim 23, wherein the germanium containing layer is a material selected from the group consisting of germanium, silicon germanium, silicon germanium doped with carbon, and a combination thereof.

25. The method of claim 20, wherein said forming the first semiconductor device of the first conductivity in the first conductivity region and the second semiconductor device of the second conductivity in the second conductivity region comprises:
forming a first gate structure in the first conductivity region and a second gate structure in the second conductivity region;
forming first source regions and first drain regions of a p-type conductivity in the first conductivity region; and
forming second source regions and second drain regions of an n-type conductivity in the second conductivity region.

* * * * *